United States Patent
Min et al.

(10) Patent No.: US 10,128,240 B2
(45) Date of Patent: Nov. 13, 2018

(54) SEMICONDUCTOR DEVICE AND METHOD FOR FABRICATING THE SAME

(71) Applicant: Samsung Electronics Co., Ltd., Suwon-si, Gyeonggi-do (KR)

(72) Inventors: Sun Ki Min, Seoul (KR); Sang Koo Kang, Seoul (KR); Koung Min Ryu, Hwaseong-si (KR); Gi Gwan Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/807,012

(22) Filed: Nov. 8, 2017

(65) Prior Publication Data
US 2018/0138174 A1 May 17, 2018

(30) Foreign Application Priority Data
Nov. 14, 2016 (KR) .................. 10-2016-0150808

(51) Int. Cl.
| | |
|---|---|
| *H01L 29/06* | (2006.01) |
| *H01L 27/088* | (2006.01) |
| *H01L 21/311* | (2006.01) |
| *H01L 21/8234* | (2006.01) |
| *H01L 23/535* | (2006.01) |
| *H01L 29/08* | (2006.01) |
| *H01L 29/417* | (2006.01) |

(Continued)

(52) U.S. Cl.
CPC .... *H01L 27/0886* (2013.01); *H01L 21/31111* (2013.01); *H01L 21/823418* (2013.01); *H01L 21/823431* (2013.01); *H01L 21/823437* (2013.01); *H01L 21/823468* (2013.01); *H01L 23/535* (2013.01); *H01L 29/0649* (2013.01); *H01L 29/0847* (2013.01); *H01L 29/41783* (2013.01); *H01L 29/4232* (2013.01); *H01L 29/6656* (2013.01); *H01L 29/66545* (2013.01); *H01L 29/66636* (2013.01); *H01L 29/7848* (2013.01)

(58) Field of Classification Search
CPC ............ H01L 29/785; H01L 29/66795; H01L 29/0649; H01L 29/6656
See application file for complete search history.

(56) References Cited

U.S. PATENT DOCUMENTS

| | | |
|---|---|---|
| 8,609,510 B1 | 12/2013 | Banna et al. |
| 9,299,700 B2 | 3/2016 | Park et al. |

(Continued)

*Primary Examiner* — Jaehwan Oh
(74) *Attorney, Agent, or Firm* — Harness, Dickey & Pierce, P.L.C.

(57) ABSTRACT

A semiconductor device includes a substrate including first to third regions, wherein the third region is positioned in a first direction between the first and second regions, a fin protruding on the substrate and extending in the first direction, first and second gate structures respectively formed on the fin in the first and second regions, first and second spacers formed with spacing apart from each other on the fin in the third region. The first and second spacers are sloped in a direction away from each other, and the first and second spacers and an upper surface of the fin define a plurality of acute angles, the first and second spacers defining a recess, the fin and the first and second spacers defining sidewalls of the recess, and a device isolating film substantially filling the recess.

20 Claims, 26 Drawing Sheets

(51) Int. Cl.
*H01L 29/423* (2006.01)
*H01L 29/66* (2006.01)
*H01L 29/78* (2006.01)

(56) References Cited

U.S. PATENT DOCUMENTS

| | | |
|---|---|---|
| 9,349,651 B2 | 5/2016 | Kim et al. |
| 9,362,181 B1 | 6/2016 | Xie et al. |
| 9,368,496 B1 | 6/2016 | Yu et al. |
| 9,728,601 B2 * | 8/2017 | Kim ................... H01L 27/0924 |
| 9,859,163 B2 * | 1/2018 | Han ................ H01L 21/823431 |
| 2015/0325575 A1 * | 11/2015 | Park ................... H01L 29/0653 |
| | | 257/401 |
| 2016/0111336 A1 | 4/2016 | Chang et al. |
| 2016/0190130 A1 | 6/2016 | Yu et al. |
| 2017/0294355 A1 * | 10/2017 | Kim ................ H01L 21/823431 |

* cited by examiner

SEMICONDUCTOR DEVICE AND METHOD FOR FABRICATING THE SAME

CROSS-REFERENCE TO RELATED APPLICATION

This application claims priority from Korean Patent Application No. 10-2016-0150808 filed on Nov. 14, 2016 in the Korean Intellectual Property Office, and all the benefits accruing therefrom under 35 U.S.C. 119, the contents of which in their entirety are herein incorporated by reference.

BACKGROUND

1. Technical Field

Example embodiments relate to a semiconductor device and/or a method for fabricating the same.

2. Description of the Related Art

One of the scaling technologies to increase the density of semiconductor devices includes a multi-gate transistor in which silicon bodies in a fin or nano wire shape are formed on a substrate, with gates subsequently being formed on surfaces of the silicon bodies.

Such multi-gate transistor allows easier scaling, as the transistor includes a three-dimensional channel. Further, current control capability can be enhanced without requiring an increased gate length of the multi-gate transistor. Furthermore, it is possible to effectively reduce or suppress short channel effect (SCE), which is when the electric potential of a channel region is influenced by a drain voltage.

According to an example embodiment, a semiconductor device includes a substrate having first to third regions, wherein the third region is positioned in a first direction between the first and second regions, a fin protruding on the substrate and extending in the first direction, first and second gate structures respectively formed on the fin in the first and second regions, first and second spacers formed apart from each other on the fin in the third region, wherein the first and second spacers are sloped in a direction away from each other, and each or at least one of the angles between the first and second spacers and an upper surface of the fin is an acute angle, a recess is formed between the first and second spacers, wherein sidewalls of the recess are the fin, and the first and second spacers and a device isolating film substantially fill the recess.

According to another example embodiment, a semiconductor device includes a fin protruding on a substrate and extending in a first direction, first and second gate structures formed on the fin with spacings therebetween, first and second spacers formed on the fin and between the first and second gate structures, the first and second spacers being formed with spacings therebetween, a recess formed between the first and second spacers, wherein sidewalls of the recess are the fin, and the first and second spacers, a device isolating film filling the recess, an interlayer insulating film overlying the device isolating film, and the first and second gate structures and a contact penetrating the interlayer insulating film and formed respectively on side surfaces of the first and second spacers, wherein the first and second spacers are sloped in a direction of the contact, but are not in contact with the contact.

SUMMARY

Example embodiments relate to a semiconductor device with improved operating characteristics.

Example embodiments also relate to a method for fabricating a semiconductor device with improved operating characteristics.

The example embodiments are not limited to those set forth above, and embodiments other than those set forth above will be dearly understood to a person skilled in the art from the following description In some example embodiments, a semiconductor device includes a fin protruding on a substrate, a sloped recess within the fin, first and second gate structures on the fin at opposite sides of the sloped recess, first and second spacers at opposite sides of the sloped recess between the first and second gate structures, and a device isolating film filling the recess.

BRIEF DESCRIPTION OF THE DRAWINGS

The above and other features and advantages of the example embodiments will become more apparent to those of ordinary skill in the art by describing in detail example embodiments thereof with reference to the accompanying drawings.

DETAILED DESCRIPTION

These and other features and advantages are described in, or are apparent from, the following detailed description of various example embodiments.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Hereinbelow, a semiconductor device according to some example embodiments will be described with reference to FIGS. 1 to 3.

Figure 1:
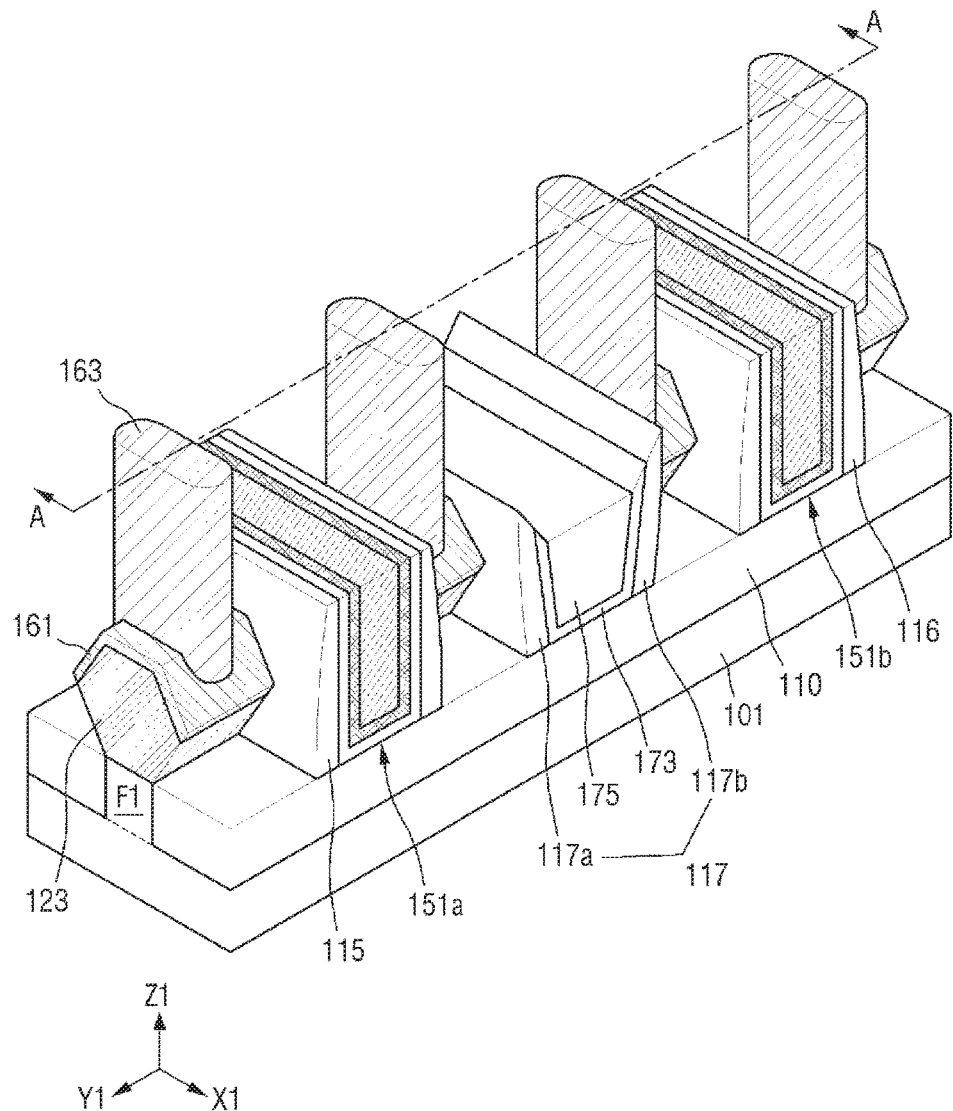
FIG. 1 is a perspective view describing a semiconductor device according to some example embodiments.
Figure 2:
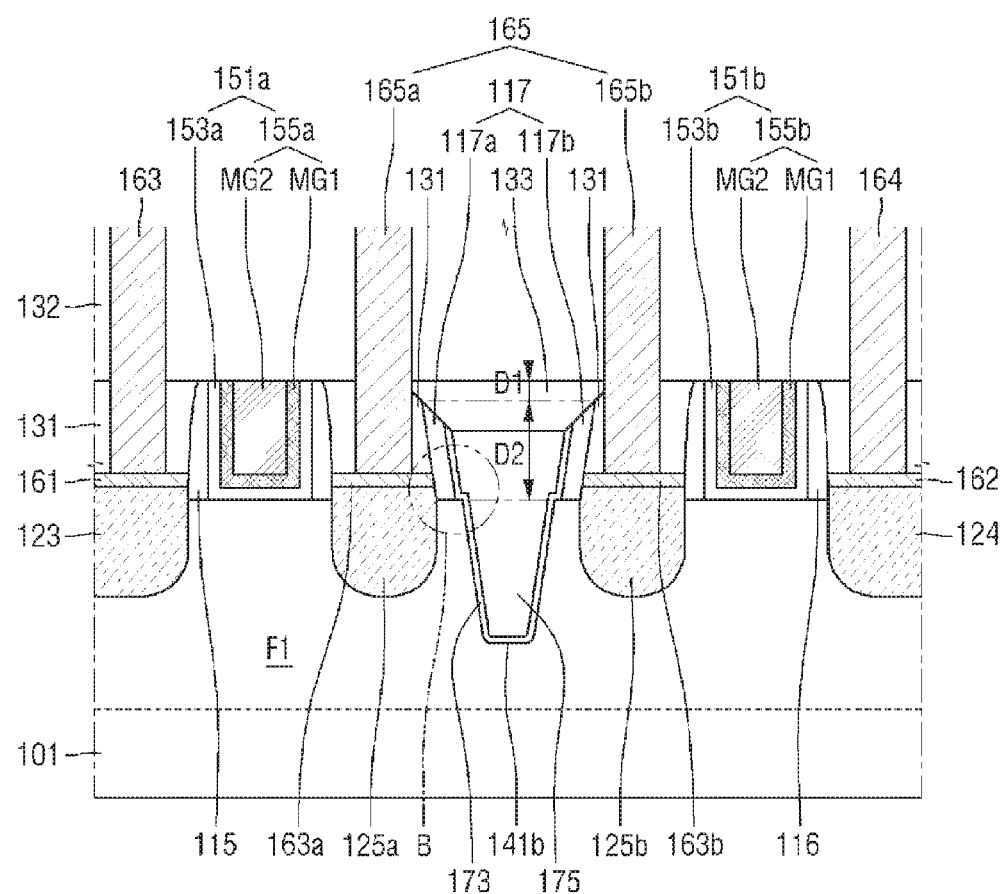
FIG. 2 is a cross sectional view taken on line A-A of FIG. 1.

FIG. 1 is a perspective view of a semiconductor device according to some example embodiments, and FIG. 2 is a cross sectional view taken on line A-A of FIG. 1. FIG. 3 is an enlarged cross sectional view of the encircled section B of FIG. 2. FIG. 1 skips illustration of a first interlayer insulating film 131, a second interlayer insulating film 132, and a capping film 133 for convenience of explanation.

Figure 3:
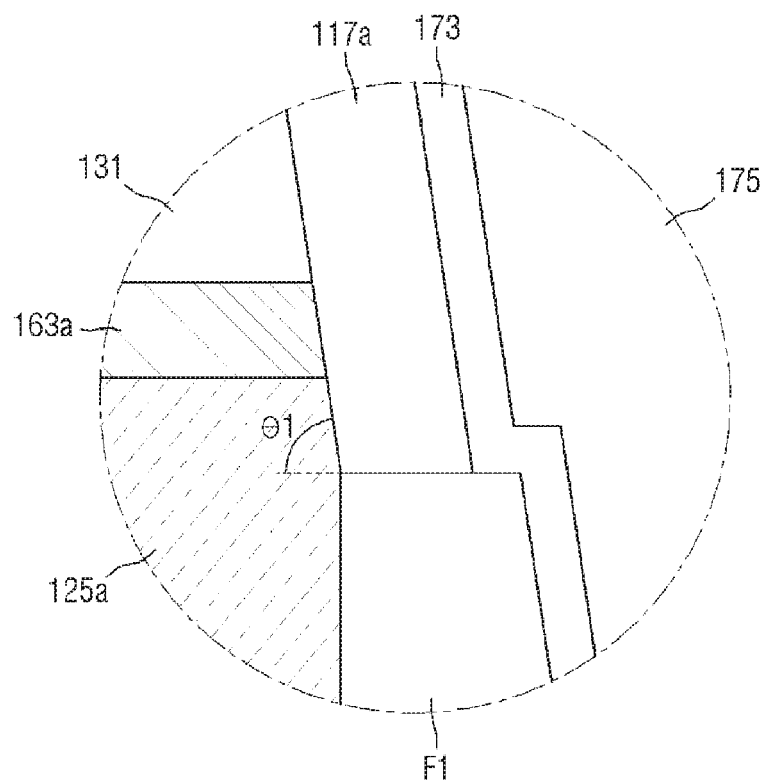
FIG. 3 is an enlarged cross sectional view of the encircled section B of FIG. 2.

Referring to FIGS. 1 to 3, the semiconductor device according to some example embodiments may include a substrate 101, a first fin F1, a field insulating film 110, a recess 141b, a device isolating film 173, first and second gate structures 151a, 151b, a first gate spacer 115, a second gate spacer 116, a first source/drain 125a, a second source/drain 125b, a third source/drain 123, a fourth source/drain 124, first and second interlayer insulating films 131, 132, a capping film 133, a silicide film 161, first and second contacts 165, a third contact 163, a fourth contact 164, and so on.

Specifically, the substrate 101 may he formed of or include one or more semiconductor materials selected from Si, Ge, SiGe, GaP, GaAs, SiC, SiGeC, InAs and InP. Further, a silicon on insulator (SOI) substrate may be used.

The first fin F1 may be formed to protrude from the substrate 101 in a third direction Z1. The first fin F1 may each extend longitudinally along a length direction, i.e., in a first direction X1. The first fin F1 may have a long side and a short side. Although FIG. 1 illustrates that the long side is directed to the first direction X1 and the short side is directed to second direction Y1, the example embodiments are not limited hereto. For example, the first fin F1 may have the long side in the second direction Y1 and the short side in the first direction X1.

The first fin F1 may be a part of the substrate 101, and may include an epitaxial layer grown from the substrate 101. For example, the first fin F1 may include Si or SiGe. The field insulating film 110 may be formed on the substrate 100, and may partially overlie a sidewall of the first fin F1 while exposing an upper surface of the first fin F1. For example, the field insulating film 110 may be an oxide film.

The first and second gate structures 151a, 151b may be disposed at a distance from each other. Each, or at least one, of the first and second gate structures 151a, 151b may intersect the first fin F1. Although FIG. 1 illustrates that the first and second gate structures 151a, 151b extend in the second direction Y1, example embodiments may not be limited hereto. Accordingly, the first and second gate structures 151a, 151b may intersect the first fin F1 by forming an acute angle or an obtuse angle with the first fin F1 on a plane view.

The first and second gate structures 151a, 151b may each include first and second gate insulating s 153a, 153b and first and second gate electrodes 155a, 155b.

Each, or at least one, of the first and second gate insulating films 153a, 153b may be formed between the first fin F1 and the first and second gate electrodes 155a, 155b. Each, or at least one, of the first and second gate insulating films 153a, 153b may be formed on an upper surface of the first fin F1 and an upper surface of a side surface (long side). Further, each, or at least one, of the first and second gate insulating films 153a, 153b may be disposed between the first and second gate electrodes 155a, 155b and the field insulating film 110. Such first and second gate insulating films 153a, 153b may include a high-k dielectric material having a higher dielectric constant than a silicon oxide film. For example, the first and second gate insulating films 153a, 153b may include $HfO_2$, $ZrO_2$, LaO, $Al_2O_3$ or $Ta_2O_5$.

The first and second gate electrodes 155a, 155b may each include first and second metal layers MG1, MG2. As illustrated, each, or at least one, of the first and second gate electrodes 155a, 155b may be stacked with two or more of the first and second metal layers MG1, MG2. The first metal layer MG1 may contribute to adjusting a work function, and the second metal layer MG2 may contribute to filling a space defined by the first metal layer MG1. The first metal layer MG1 may be formed conformally along an upper surface of the field insulating film 110, and upper portion of an upper surface and a sidewall of the first fin F1. For example, the first metal layer MG1 may include at least one of TiN, TaN, TiC, TiAlC and TaC. Further, the second metal layer MG2 may include W or Al. Alternatively, the first and second gate electrodes 155a, 155b may be respectively formed of or include non-metal elements such as Si or SiGe. For example, the first and second gate structures 151a, 151b described above may be formed by a replacement process, but not limited hereto.

The first gate spacer 115 and the second gate spacer 116 may be respectively formed on sidewalls of the first and second gate strictures 151a, 151b. The first gate spacer 115 and the second gate spacer 116 may be disposed on the first fin F1. The first gate spacer 115 and the second gate spacer 116 may include, for example, at least one of an oxide film, a nitride film, and an oxynitride film, and differently from the illustration of drawings, a plurality of layers may be stacked and formed instead of a single layer.

A first spacer 117a and a second spacer 117b may be formed between the first gate structure 151a and the second gate structure 151b. The first spacer 117a and the second spacer 117b may be spaced apart from each other in the second direction Y1. That is, the first spacer 117a may be positioned between the first gate structure 151a and the second spacer 117b, and the second spacer 117b may be positioned between the second gate stricture 151b and the first spacer 117a.

The first spacer 117a and the second spacer 117b may be simultaneously or contemporaneously formed with the first gate spacer 115 and the second gate spacer 116. That is, a material of the first spacer 117a and the second spacer 117b may be same as a material of the first gate spacer 115 and the second gate spacer 116.

The first spacer 117a and the second spacer 117b may be sloped in a direction of an increasing distance away from each other. This may be attributable to the tensile stress of a material in the first spacer 117a and the second spacer 117b. Accordingly, a first angle θ1 between an outer side surface of the first spacer 117a (in a direction of the first gate structure 151a) and an upper surface of the first fin F1, may be an acute angle. Specifically, the first angle θ1 may be greater than about 85 degrees and less than about 90 degrees. Likewise, an angle between an outer side surface of the second spacer 117b (direction of the second gate structure 151b) and an upper surface of the first fin F1 may be an acute angle equal to or greater than about 85 degrees and less than about 90 degrees.

In some example embodiments, a height D2 of the first spacer 117a and the second spacer 117b may be less than the first gate spacer 115 and the second gate spacer 116. That is, the first spacer 117a and the second spacer 117b may be formed at a height which is less than, by a first distance D1, a height of the first gate spacer 115 and the second gate spacer 116. This may be attributable to the upper portion of the first spacer 117a and the second spacer 117b being at least partially removed with an etch process, and being sloped thereafter. In an example, a height D2 of the first spacer 117a and the second spacer 117b may be about 20 to 26 nm. However, example embodiments are not limited to the example given above.

In some example embodiments, the recess 141b may be formed within the first fin F1 in the first direction X1. The recess 141b may be formed between the first gate structure 151a and the second gate structure 151b. Specifically, the recess 141b may be formed between the first spacer 117a and the second spacer 117b.

A lower surface of the recess 141b may be lower than or level with lower surfaces of the first to fourth source/drains 125a, 125b, 123, 124. The lower surface of the recess 141b may be even lower on the first fin F1 than on the field insulating film 110, but not limited hereto.

The recess 141b may have a jaw on the upper surface of the first fin F1. That is, there may be an exposed portion of the upper surface of the first fin F1 which is not covered by the first spacer 117a and the second spacer 117b.

Although FIG. 2 illustrates that the recess 141b has a trench shape of which a width becomes narrower as in a downward direction from an upper portion to a lower portion, the example embodiments may not be limited hereto. Accordingly, the recess 141b may have, for example, U-shape, V-shape, rectangular-shape, trapezoid-shape, and so on.

The device isolating film 175 may fill the recess 141b. Accordingly, the device isolating film 175 may extend in the second direction Y1. The device isolating film 175 may be formed on the field insulating film 110, and formed within the first fin F1. Because the device isolating film 175 fills the recess 141b, the lower surface of the device isolating film 175 may be lower than lower surfaces of the first to fourth source/drains 125a, 125b, 123, 124. The device isolating film 175 may isolate the first and second source drains 125a, 125b formed on both sides of the device isolating film 175, to block a short and hinder or prevent the currents from flowing. The device isolating film 175 may be, for example, an oxide film, a nitride film, an oxynitride film, and so on. The device isolating film 175 may be spaced apart from the first to fourth source/drains 125a, 125b, 123, 124.

A liner 173 may be disposed between the recess 141b and the device isolating film 175. The liner 173 may be formed substantially conformally along the sidewalls of the first and second spacers 117, an upper surface of the first fin F1, and an inner surface of the recess 141b. The liner 173 may be disposed on the first fin F1 and the field insulating film 110.

The liner 173 may include, for example, at least one of silicon oxide, silicon nitride, silicon oxynitride, Hf oxide, La oxide, polysilicon, Ge, Ge oxide, Ti oxide, and W oxide.

The first spacer 117a and the second spacer 117b may have a sloped upper surface. The upper surface of the first spacer 117a may be highest in a direction of the first gate structure 151a and may decrease in a direction of the second gate structure 151b. On the other hand, the upper surface of the second spacer 117b may be highest in a direction of the second gate structure 151b and become lower in a direction of the first gate structure 151a.

The upper surface of the liner 173 may be also highest at a portion in contact with the first and second spacers 117 and become lower as distance increases. A portion of the upper surface of the liner 173, which is in contact with the device isolating film 175, may have the same height as the height of the upper surface of the device isolating film 175.

The first to fourth source/drains 125a, 125b, 123, 124 may be disposed on both sides of the first and second gate structures 151a, 151b and both sides of the device isolating film 175. In other words, the first source/drain 125a may be disposed between ate structure 151a and the first spacer 117a, and the second source/drain 125b may be disposed between the second gate structure 151b and the second spacer 117b. Further, the third source/drain 123 may be disposed on a side surface opposite the device isolating film 175 with reference to the first gate structure 151a, and the fourth source/drain 124 may be disposed on a side surface opposite the device isolating film 175 with reference to the second gate structure 151b.

The first to fourth source/drains 125a, 125b, 123, 124 may be disposed within the first fin F1. Accordingly, each of the first to fourth source/drains 125a, 125b, 123, 124 may be respectively formed on the etched portion formed by etching a portion of the first fin F1.

The first to fourth source/drains 125a, 125b, 123, 124 may be elevated source/drains. Accordingly, the upper surfaces of the first to fourth source/drains 125a, 125b, 123, 124 may be higher than the upper surface of the first fin F1.

When the semiconductor device according to e example embodiments is a PMOS transistor, the first to fourth source/drains 125a, 125b, 123, 124 may include a compressive stress material. For example, the compressive stress material may be a material such as SiGe, which has a greater lattice constant than Si. The compressive stress material may exert a compressive stress on the first fin F1 of the lower portion of the first and second gate structures 151a, 152b, i.e., on the channel region, and thus enhance mobility of carriers in the channel region.

When the semiconductor device according to some example embodiments is an NMOS transistor, the first to fourth source/drains 125a, 125b, 123, 124 may include the same material as the substrate 101 or a tensile stress material. For example, when the substrate 101 is Si, the first to third source/drains 121, 123, 125 may be Si, or other material (e.g., SiC, SiP) that has a lower lattice constant than Si.

The first to fourth source/drains 125a, 125b, 123, 124 may be formed with the epitaxial growth.

The first to fourth source/drains 125a, 125b, 123, 124 may have the silicide film 161 disposed thereon. The silicide film 161 may be formed along the upper surfaces of the first to fourth source/drains 125a, 125b, 123, 124. The silicide film 161 may play a role of reducing sheet resistance, contact resistance, and so on, when the first to fourth source/drains 125b, 123, 124 are respectively in contact with first and second contacts 165, a third contact 163, and a fourth contact 164, and may include a conductive material, e.g., Pt, Ni, Co, and so on.

On the silicide film 161, the first and second contacts 165, the third contact 163, and the fourth contact 164 may be formed respectively. Specifically, the first contact 165a and the third contact 163 may be formed on both sides of the first gate structure 151a. The first contact 165a may be formed between the first gate structure 151a and the device isolating film 175. The second contact 165b and the fourth contact 164 may be formed on both sides of the second gate structure 151b. The second contact 165b may be formed between the second gate structure 151b and the device isolating film 175.

The contact 163 may be formed of or include a conductive material, and may include, for example, W, Al Cu, and so on, but not limited hereto.

The first interlayer insulating film 131 and the second interlayer insulating film 132 may be formed, for example sequentially formed, on the field insulating film 110. The first interlayer insulating film 131 may overlay sidewalls of the silicide film 161 and the first spacer 115, and partially overlay a sidewall of the contact 163. The second interlayer insulating film 131 may overlay the other remaining sidewall of the contact 163.

The capping film 133 may be positioned between the first interlayer insulating film 131 and the second interlayer insulating film 132. Specifically, the capping film 133 may be formed on the device isolating film 175, the liner 173, the first and second spacers 117, and the first interlayer insulating film 131. The capping film 133 may include at least one of silicon oxide and silicon nitride.

As illustrated in FIG. 2, an upper surface of the first interlayer insulating film 131 and an upper surface of the capping film 133 may be positioned on a same plane as upper surfaces of the first and second gate structures 151a, 151b. Through the planarization process (e.g., CMP process), an upper surface of the first interlayer insulating film 131 and upper surfaces of the first and second gate electrodes 151a, 151b and the capping film 133 may be coplanar. The second interlayer insulating film 132 may be formed to overlay the first and second gate structures 151a, 151b and the capping film 133. The first interlayer insulating film 131 and the second interlayer insulating film 132 may include at least one of an oxide film, a nitride film, and an oxynitride.

Although the capping film 133 is illustrated as a separate constituent element in the drawings, the second interlayer insulating film 132 and the first interlayer insulating film 131 may fill the area instead of the capping film 133. Alternatively, the device isolating film 175 may fill the area instead of the capping film 133. However, example embodiments are not limited to the example given above.

In the semiconductor device according to some example embodiments, the first spacer 117a and the second spacer 117b may have a proper height range. That is, heights of the first spacer 117a and the second spacer 117b may be greater than an upper surface of the first fin F1, and less than the first gate structure 151a and the second gate structure 151b.

When heights of the first spacer 117a and the second spacer 117b are too low, stress characteristic of a material of the device isolating film 175 may influence the first source/drain 125a, the second source/drain 125b, and a channel region adjacent to the first and second source/drains 151a, 151b (i.e., the first fin F1 region under the first gate structure 151a and the second gate structure 151b). Accordingly, characteristic of the transistor may be modified in a way that is not intended.

On the other hand, when heights of the first spacer 117a and the second spacer 117b are too high, the first spacer 117a and the second spacer 117b are sloped, and accordingly, the first contact 165a and the second contact 165b may not be properly formed in the subsequent process, as these overlap with vertical positions of the first spacer 117a and the second spacer 117b. That is, the first source/drain 125a and the first contact 165a may not be connected due to the first spacer 117a, and the second source/drain 125b and the second contact 165b may not be connected due to the second spacer 117b.

Accordingly, some example embodiments can encourage the first contact 165a and the second contact 165b to be formed into a complete shape while keeping the first spacer 117a and the second spacer 117 at proper heights, and minimize stress caused by the device isolating film 175 on the channel region, thereby considerably enhancing performance of the semiconductor device.

Hereinbelow, a semiconductor device according to some example embodiments will be described with reference to FIGS. 4 and 5. In the following description, description overlapped with the example embodiments already provided above will not be described or described as brief as possible for the sake of brevity.

Figure 4:
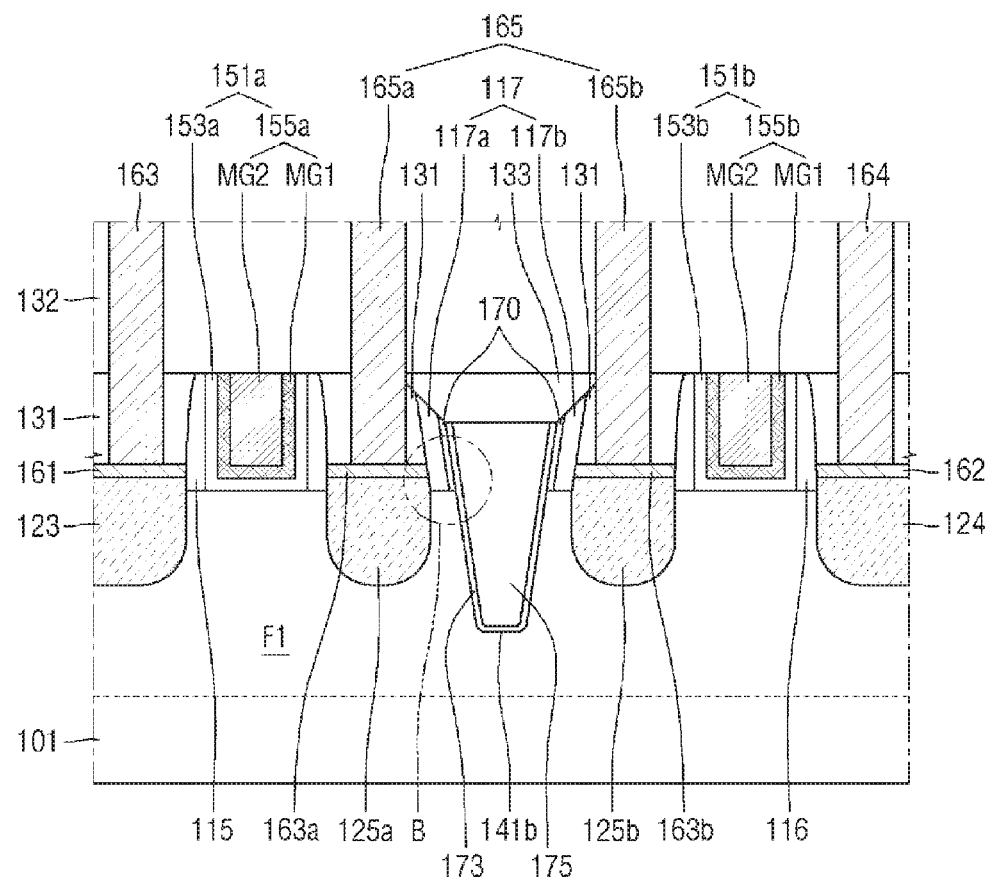
FIG. 4 is a cross sectional view of a semiconductor device according to some example embodiments.
Figure 5:
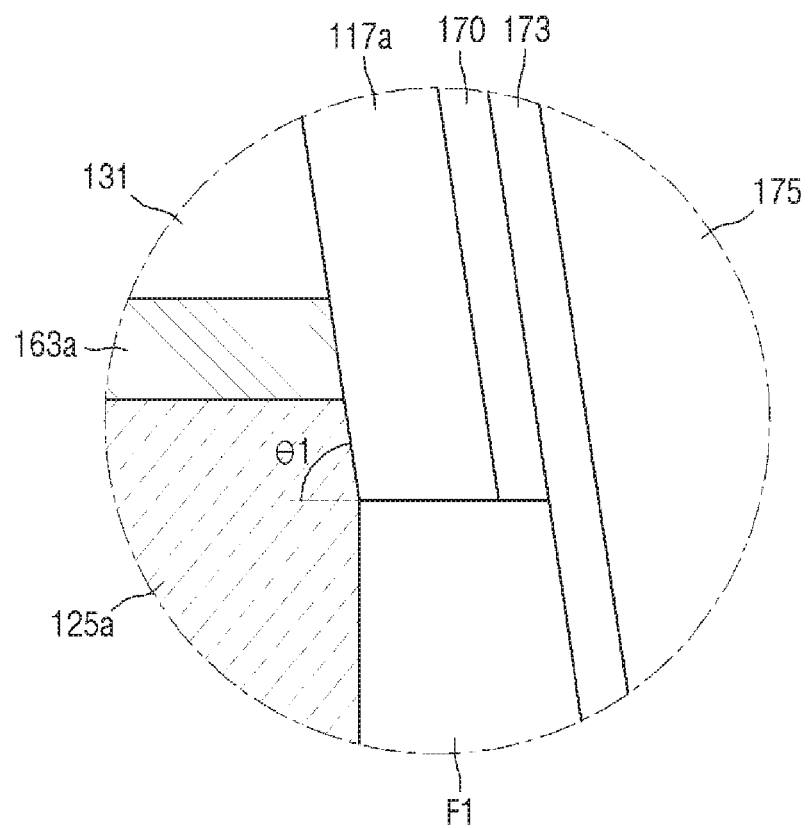
FIG. 5 is an enlarged cross sectional view of the encircled section B of FIG. 4.

FIG. 4 is a cross sectional view of a semiconductor device according to some example embodiments, and FIG. 5 is an enlarged cross sectional view of the encircled section B of FIG. 4.

Referring to FIGS. 4 and 5, the semiconductor device according to some example embodiments may additionally include an inner spacer 170.

The inner spacer 170 may be disposed between the device isolating film 175 and the first spacer 117a and the second spacer 117b. Specifically, the inner spacer 170 may be formed on sidewalls of the first spacer 117a and the second spacer 117b. A profile of the inner spacer 170 may be connected with a profile of the recess 141b. The liner 173 may be conformally formed along inner surfaces of the inner spacer 170 and the recess 141b, and the device isolating film 175 may be formed on the liner 173.

With the inner spacer 170, the recess 141b may include a smooth sidewall without a presence of jaw structure. An upper surface of the inner spacer 170 may be sloped. The inner spacer 170 may be highest at a portion thereof in contact with the first and second spacers 117, and may have an upper surface that gradually decreases as distance from the first and second spacers 117 increases.

The capping film 133 may be formed on the first interlayer insulating film 131, the inner spacer 170, the liner 173, and the device isolating film 175.

Hereinbelow, a semiconductor device according to some example embodiments will be described with reference to FIGS. 6 and 7. In the following description, any description that overlaps the example embodiments already provided above will not be described, or described briefly, for the sake of brevity.

Figure 6:
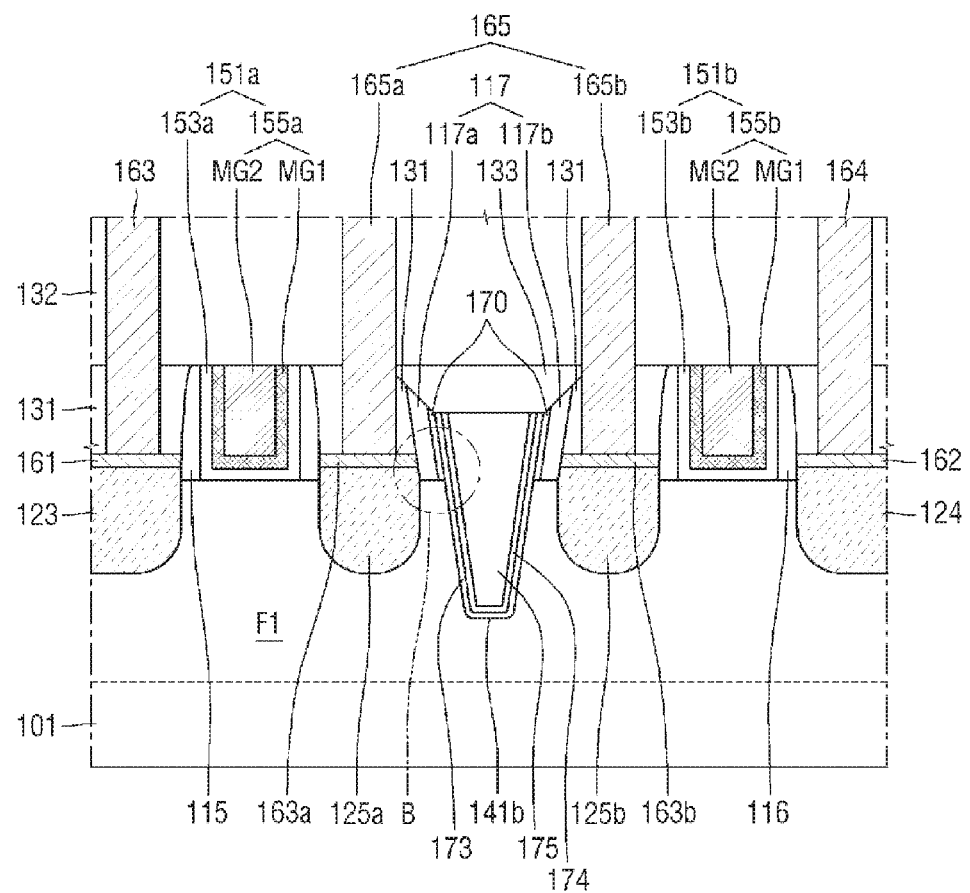
FIG. 6 is a cross sectional view of a semiconductor device according to some example embodiments.
Figure 7:
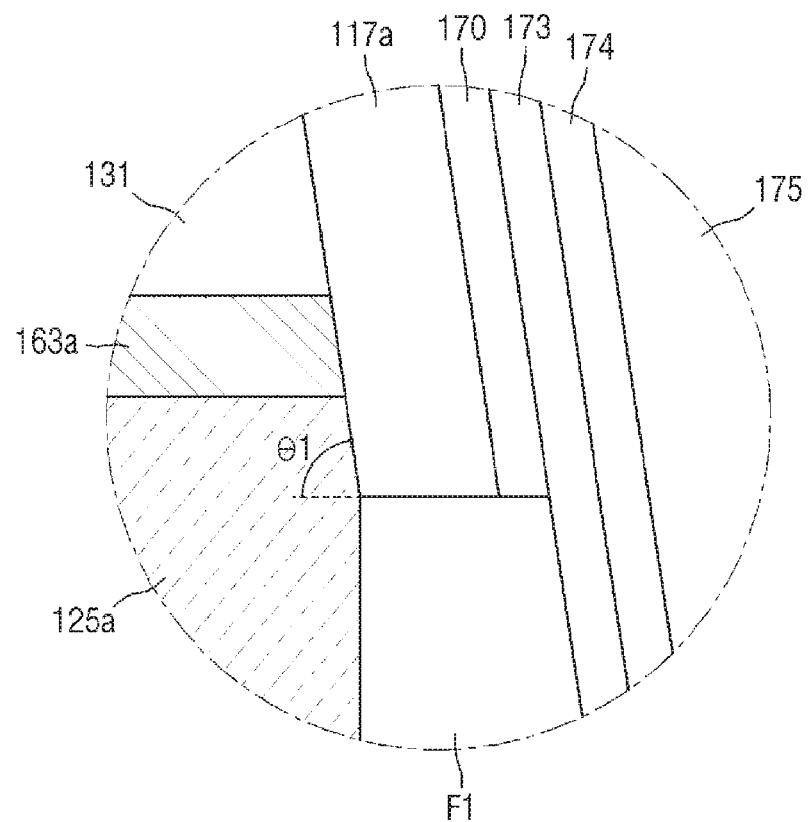
FIG. 7 is an enlarged cross sectional view of the encircled section B of FIG. 6.

FIG. 6 is a cross sectional view of a semiconductor device according to some example embodiments, and FIG. 7 is an enlarged cross sectional view of the encircled section B of FIG. 6.

Referring to FIGS. 6 and 7, the semiconductor device according to some example embodiments may additionally include a second liner 174.

The second liner 174 may be formed between the liner 173 and the device isolating film 175, and the second liner 174 may be formed conformally along inner surfaces of the inner spacer 170 and the recess 141b.

For example, the second liner 174 may include at least one of silicon oxide, silicon nitride, silicon oxynitride, Hf oxide, La oxide, polysilicon, Ge, Ge oxide, Ti oxide, and W oxide.

In the semiconductor device according to some example embodiments, multi-films of the liner 173 and the second liner 174 may hinder or prevent formation of an air gap with the restoration of the damaged surface portion of the recess 141b and gap filling capacity.

Hereinbelow, a semiconductor device according to some example embodiments will be described with reference to FIGS. 8 and 9. In the following description, description overlapped with the example embodiments already provided above will not be described, or described briefly, for the sake of brevity.

Figure 8:
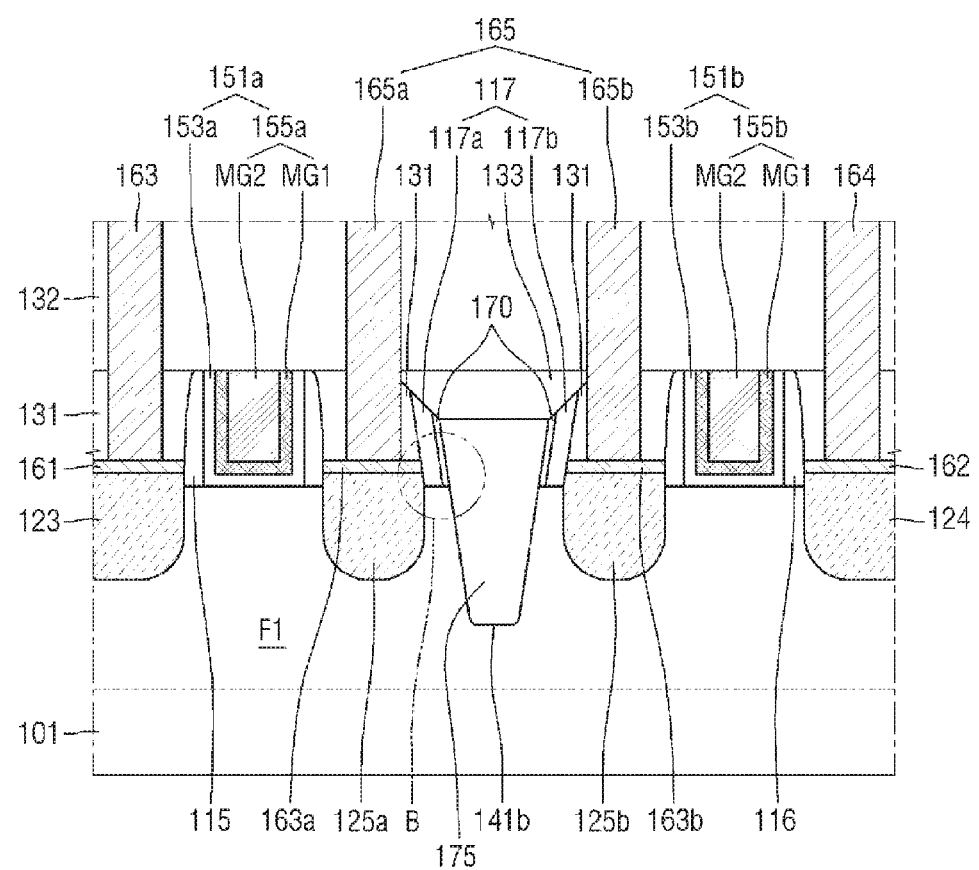
FIG. 8 is a cross sectional view of a semiconductor device according to some example embodiments.
Figure 9:
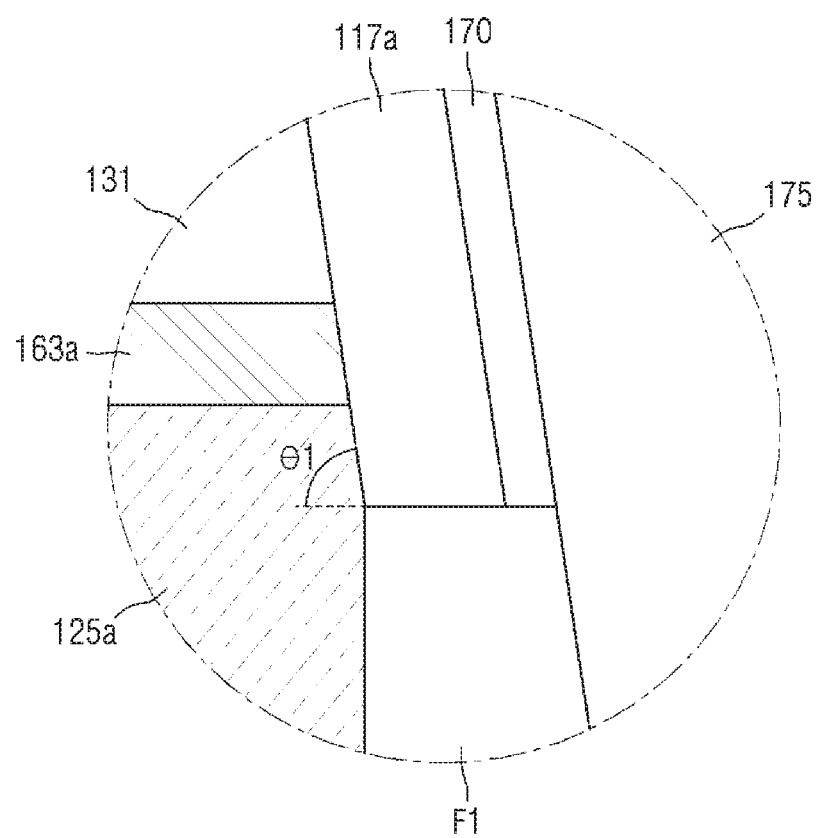
FIG. 9 is an enlarged cross sectional view of the encircled section B of FIG. 8.

FIG. 8 is a cross sectional view of a semiconductor device according to some example embodiments, and FIG. 9 is an enlarged cross sectional view of the encircled section B of FIG. 8.

Referring to FIGS. 8 and 9, the device isolating 175 of the semiconductor device according to some example embodiments may substantially fill the recess 141*b* without the liner. That is, the device isolating film 175 may be directly in contact with a sidewall of the recess 141*b*.

However, the side surface of the upper portion of the device isolating film 175 may not be in contact with the first spacer 117*a* and the second spacer 117*b*, and may be in contact with the inner spacer 170.

Accordingly, the capping film 133 may overlay the upper surfaces of the first interlayer insulating film 131, the first spacer 117*a*, the second spacer 117*b*, the inner spacer 170 and the device isolating film 175.

Hereinbelow, a semiconductor device according to some example embodiments will be described with reference to FIGS. 10 and 11. In the following description, description overlapped with the example embodiments already provided above will not be described, or described briefly, for the sake of brevity.

Figure 10:
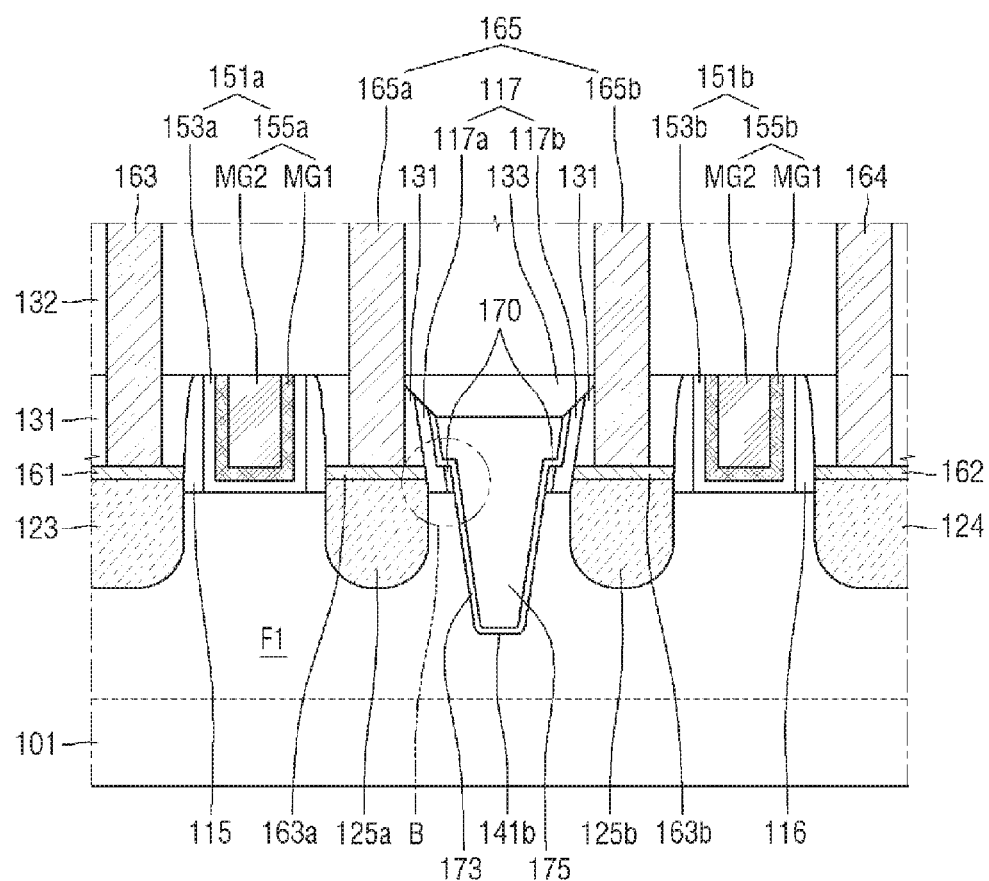
FIG. 10 is a cross sectional view of a semiconductor device according to some example embodiments.
Figure 11:
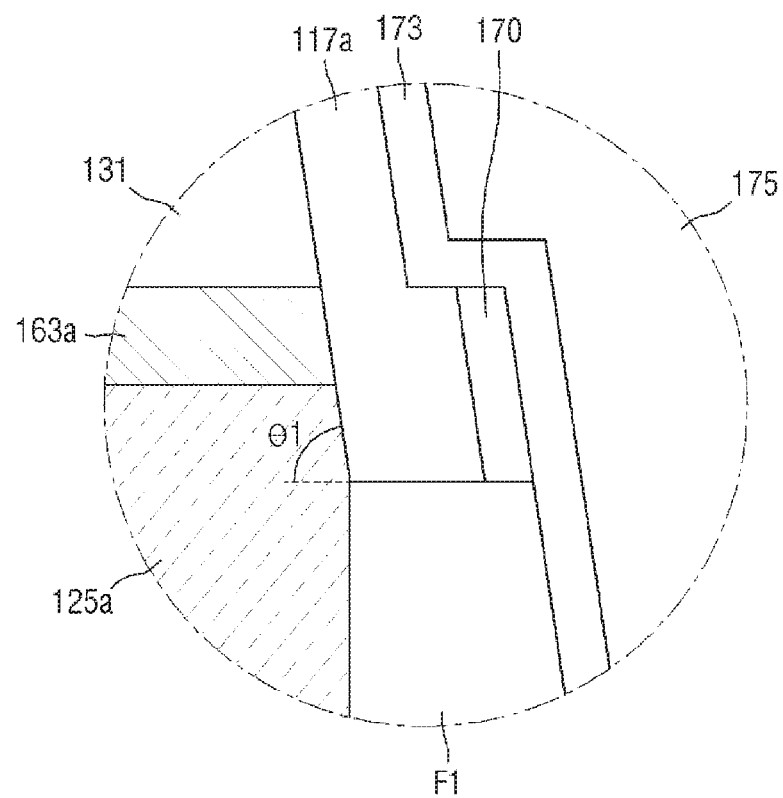
FIG. 11 is an enlarged cross sectional view of the encircled section B of FIG. 10.

FIG. 10 is a cross sectional view of a semiconductor device according to some example embodiments, and FIG. 11 is an enlarged cross sectional view of the encircled section B of FIG. 10.

Referring to FIGS. 10 and 11, the first spacer 117*a* and the second spacer 117*b* of the semiconductor device according to some example embodiments may have a L-shape.

Specifically, a width of the lower portion of the first spacer 117*a* and the second spacer 117*b* may become greater than a width of the upper portion of the first spacer 117*a* and the second spacer 117*b*, upon removal of the inner side surface of the upper portion of the first spacer 117*a* and the second spacer 117*b*.

Accordingly, the first spacer 117*a* and the second spacer 117*b* may have a L-shape that have a protruding portion in a direction of the first spacer 117*a* and the second spacer 117*b* facing each other. This may be attributable to the removal of the portion of the first and second spacers 117 with the chamfering process of forming the inner spacer 170. Accordingly, the liner 173 may be formed conformally along the inner side surface of the L-shaped first and second spacers 117.

With the chamfered shape, a width of the upper portion of the device isolating film 175 may be formed to be broader than a width of the lower portion. In an example embodiment, the device isolating film 175 may have an discontinuous side surface profile. That is, a stepped portion may be formed on the portion in which a width becomes broader, such that the upper portion and the lower portion having different widths may be clearly distinguished.

Hereinbelow, a semiconductor device according to some example embodiments will be described with reference to FIG. 12. In the following description, description overlapped with the example embodiments already provided above will not be described, or described briefly, for the sake of brevity.

Figure 12:
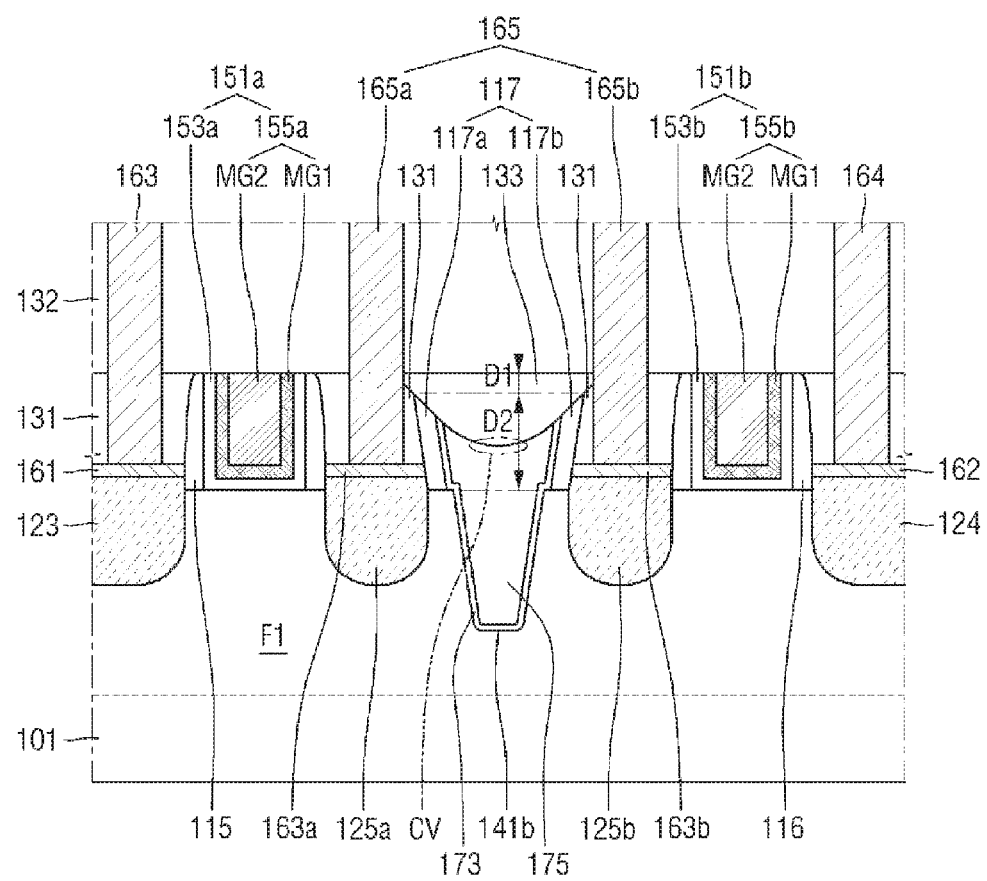
FIG. 12 is a cross sectional view of a semiconductor device according to some example embodiments.

FIG. 12 is a cross sectional view of a semiconductor device according to some example embodiments.

Referring to FIG. 12, the upper surface of the device isolating film 175 may have a downward convex shape according to some example embodiments. That is, the upper surface of the device isolating film 175 may have a downward convex profile, and the lower surface of the capping film 133 may correspondingly include a convex portion.

The upper surface of the device isolating film 175 may decrease as the distance increases from the first and second spacers 117. This may be attributable to the fact that etch selectivities of the liner 173 and the device isolating film 175 are different from each other. That is, because an etch selectivity of the device isolating film 175 is greater than the etch selectivity of the liner 173, the device isolating film 175 may be further etched than the liner 173, and may have a downward convex shape.

Hereinbelow, a semiconductor device according to some example embodiments will be described with reference to FIG. 13. In the following description, description overlapped with the example embodiments already provided above will not be described, or described briefly, for the sake of brevity.

Figure 13:
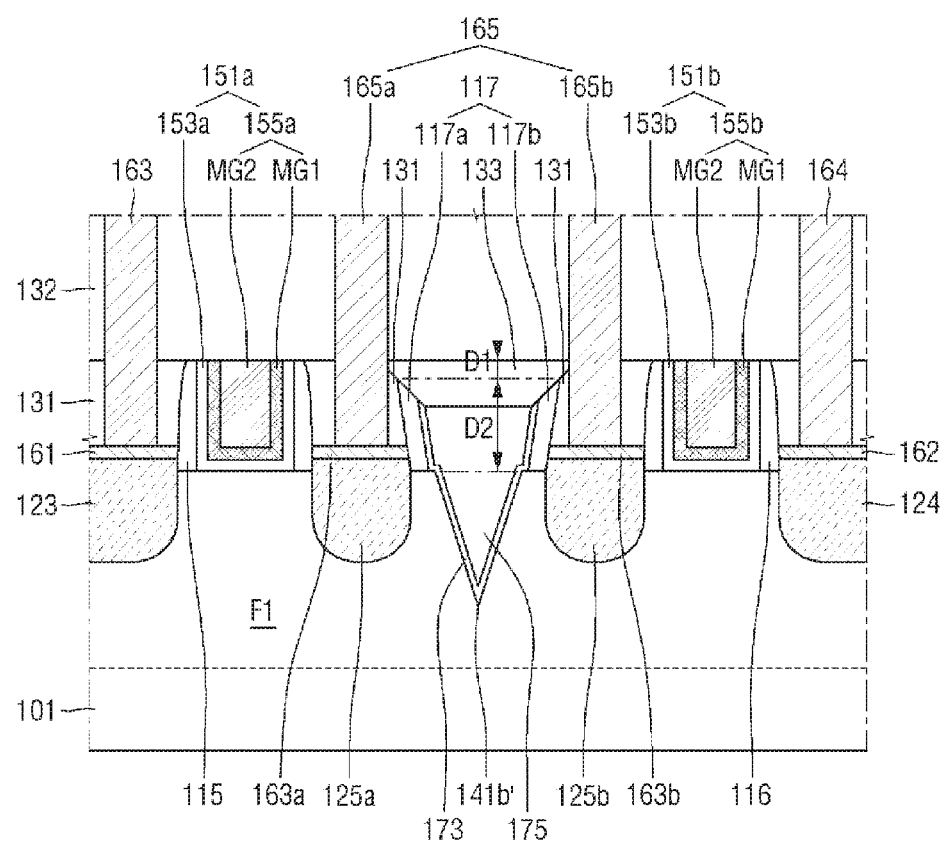
FIG. 13 is a cross sectional view of a semiconductor device according to some example embodiments.

FIG. 13 is a cross sectional view of a semiconductor device according to some example embodiments.

Referring to FIG. 13, the recess 141*b* of the semiconductor device according to some example embodiments may have V-shape in which a lower portion is pointed.

When the recess 141*b* has V-shape as illustrated in the drawing, a distance between the first source/drain 125*a* and the second source/drain 125*b* and the device isolating film 175 within the recess 141*b* may become relatively longer.

Accordingly, stress characteristic of the device isolating film 175 may minimize influence on the first source/drain 125*a* and the second source/drain 125*b*. Further, likewise, influence of stress of the device isolating film 175 affecting the channel region of the lower portion of the first gate structure 151*a* and the second gate structure 151*b*, may be minimized.

Hereinbelow, a semiconductor device according to some example embodiments will be described with reference to FIGS. 1 to 3 and 14 to 31. In the following description, description overlapped with the example embodiments already provided above will not be described, or described briefly, for the sake of brevity.

Figure 16:
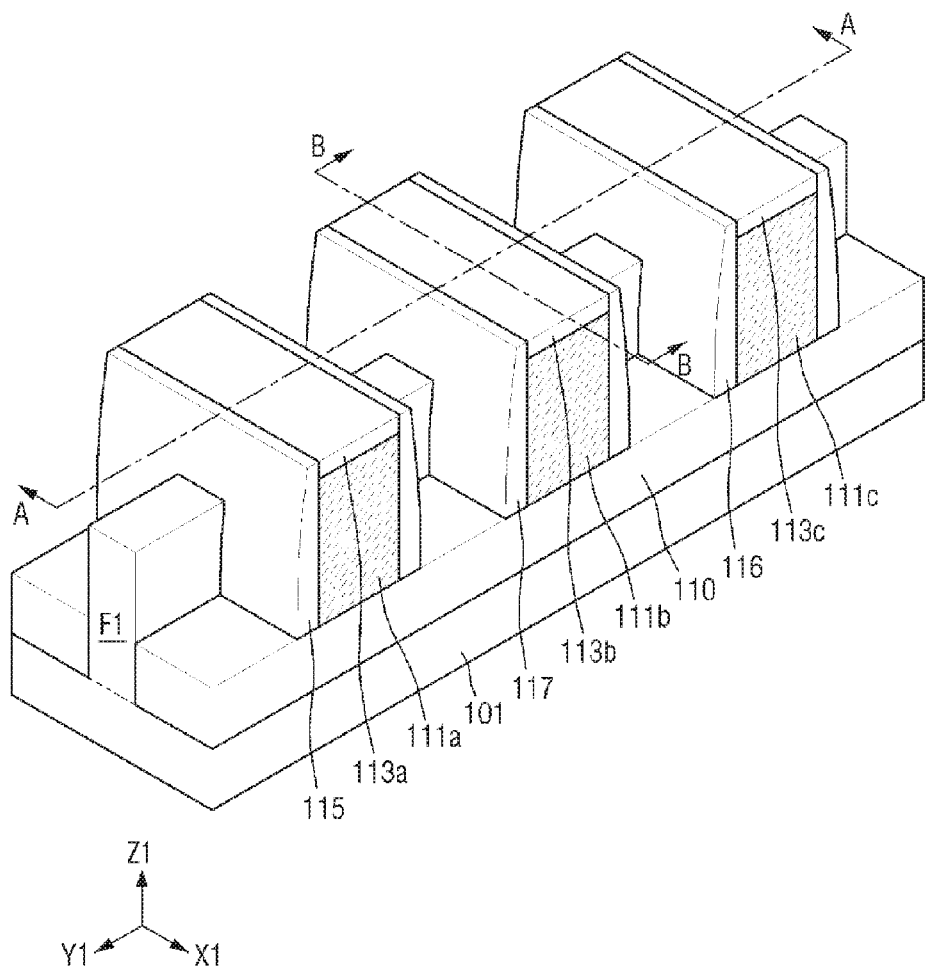
Figure 17:
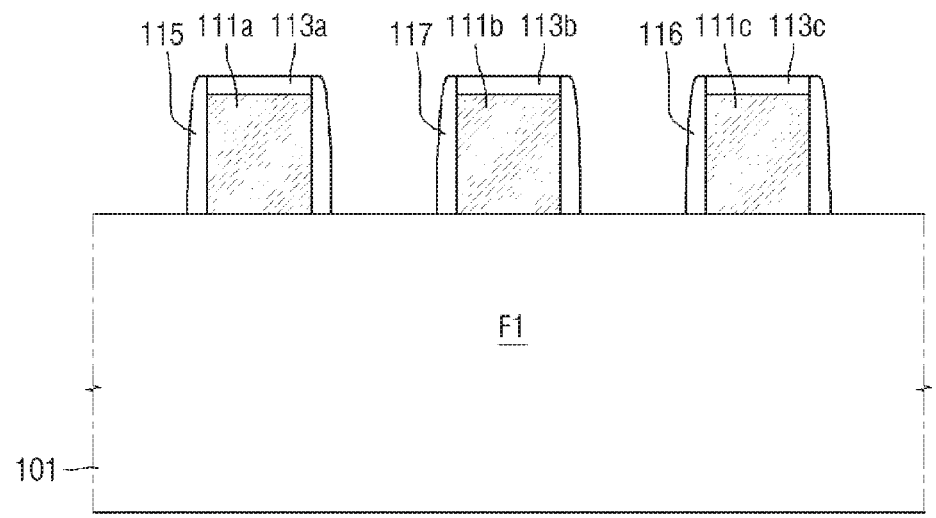
Figure 18:
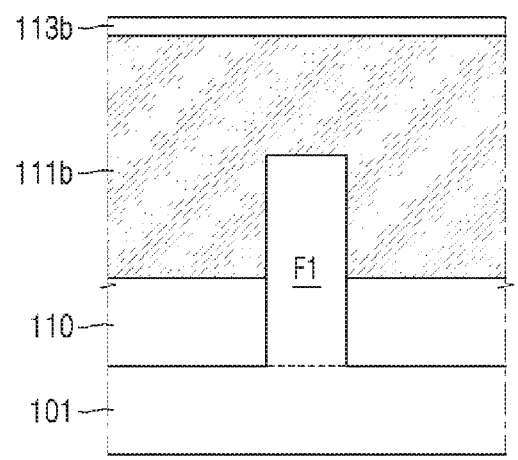
Figure 20:
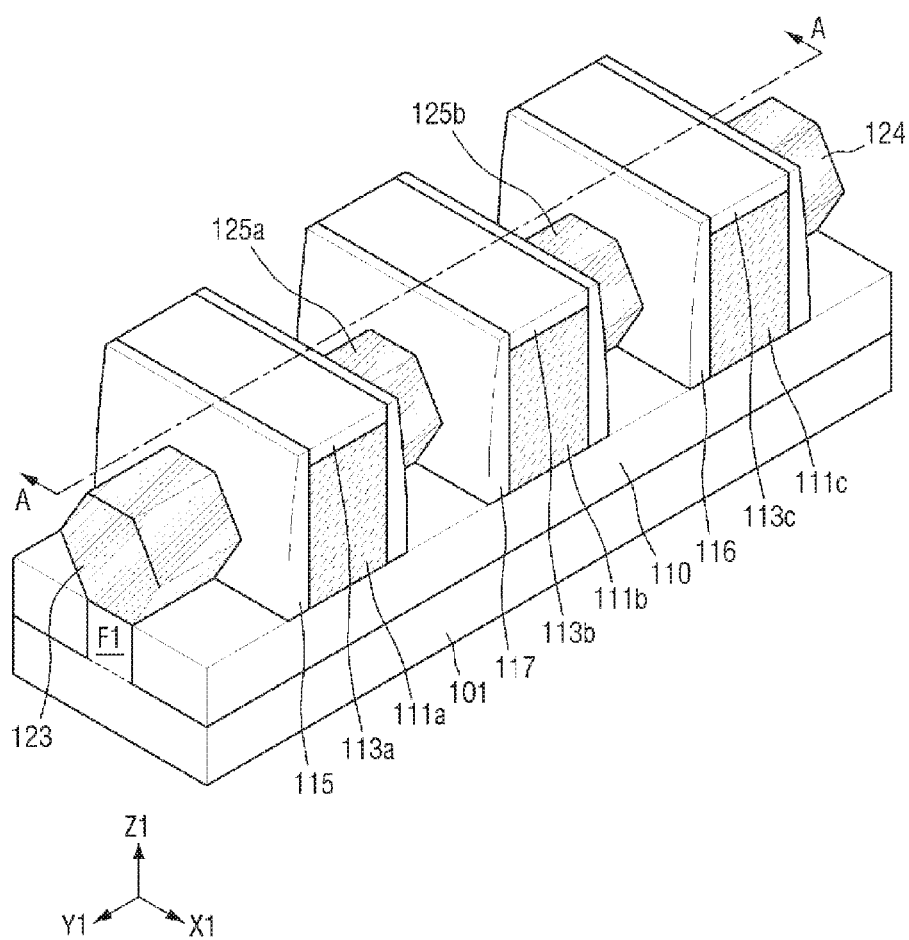
Figure 21:
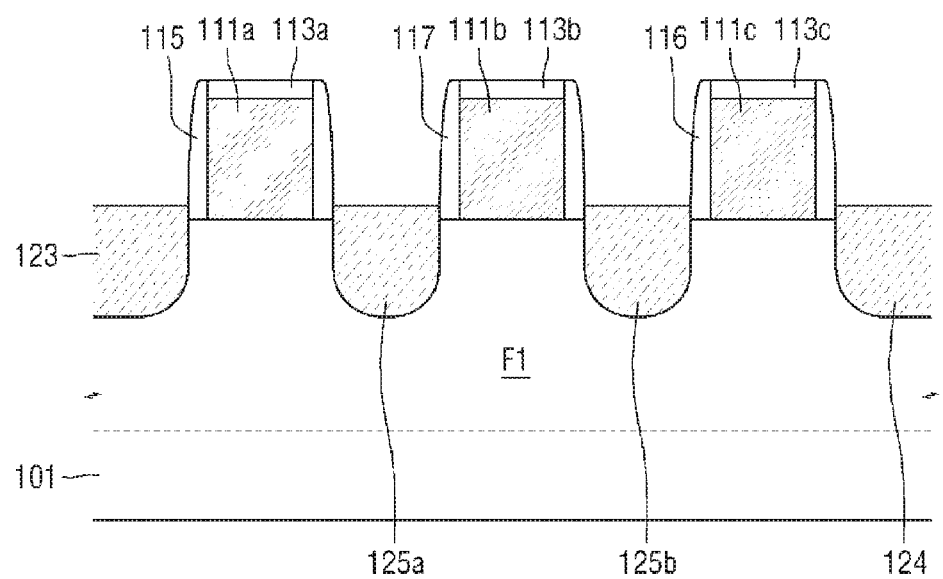

FIGS. 14 to 31 are views illustrating intermediate stages of fabrication in a method for fabricating a semiconductor device, according to some example embodiments. Specifically, FIG. 17 is a cross sectional view taken on line A-A of FIG. 16, and FIG. 18 is a cross sectional view taken on line B-B of FIG. 16. FIG. 21 is a cross sectional view taken on line A-A of FIG. 20, and FIG. 23 is a cross sectional view taken on line A-A of FIG. 22. FIGS. 23 to 31 are cross sectional views describing a following process with respect to the cross sectional view of FIG. 23.

Figure 14:
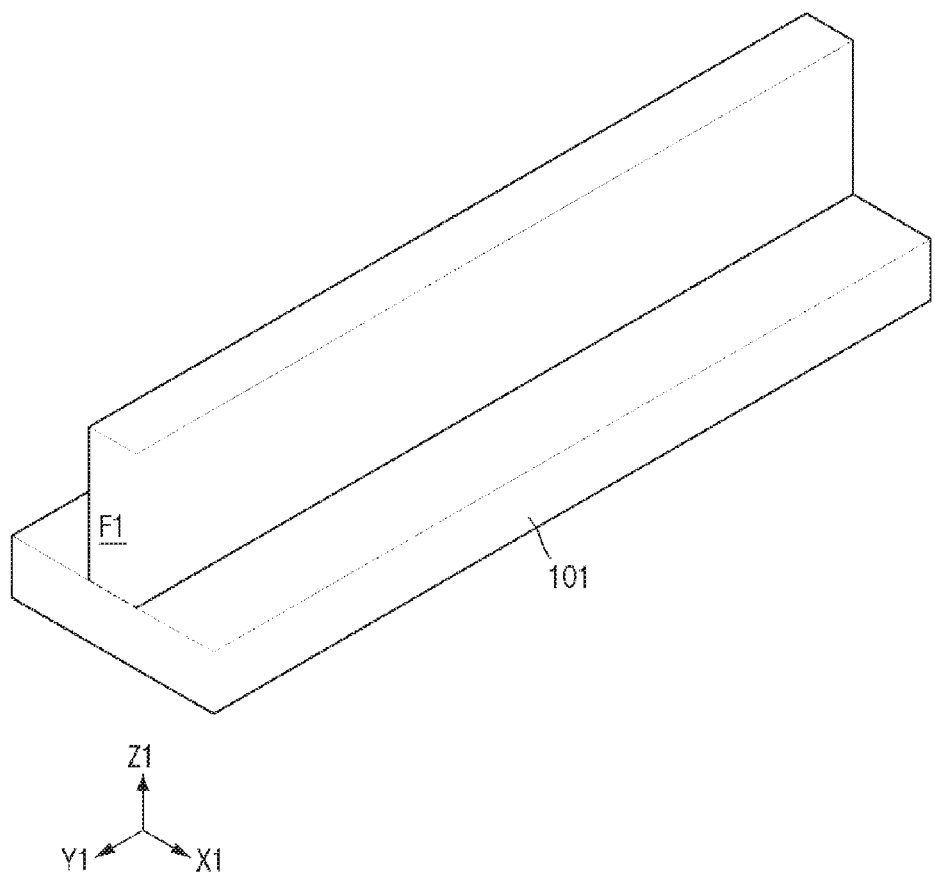
FIGS. 14 to 31 are views illustrating intermediate stages of fabrication, of a method for fabricating a semiconductor device according to some example embodiments.

Referring first to FIG. 14, the first fin F1 may be formed on the substrate 101. The first fin F1 may be formed on the substrate 101 and protrude in the third direction Z1. The first fin F1 may extend longitudinally along the first direction X1 which is a length direction, and may have a long side in the first direction X1 and a short side in the second direction Y1. However, the example embodiments are not limited hereto. For example, the long side direction may be the second direction Y1, and the short side direction may be the first direction X1.

The first fin F1 may be a part of the substrate 101, and may include an epitaxial layer grown from the substrate 101. For example, Si or SiGe may be included.

Figure 15:
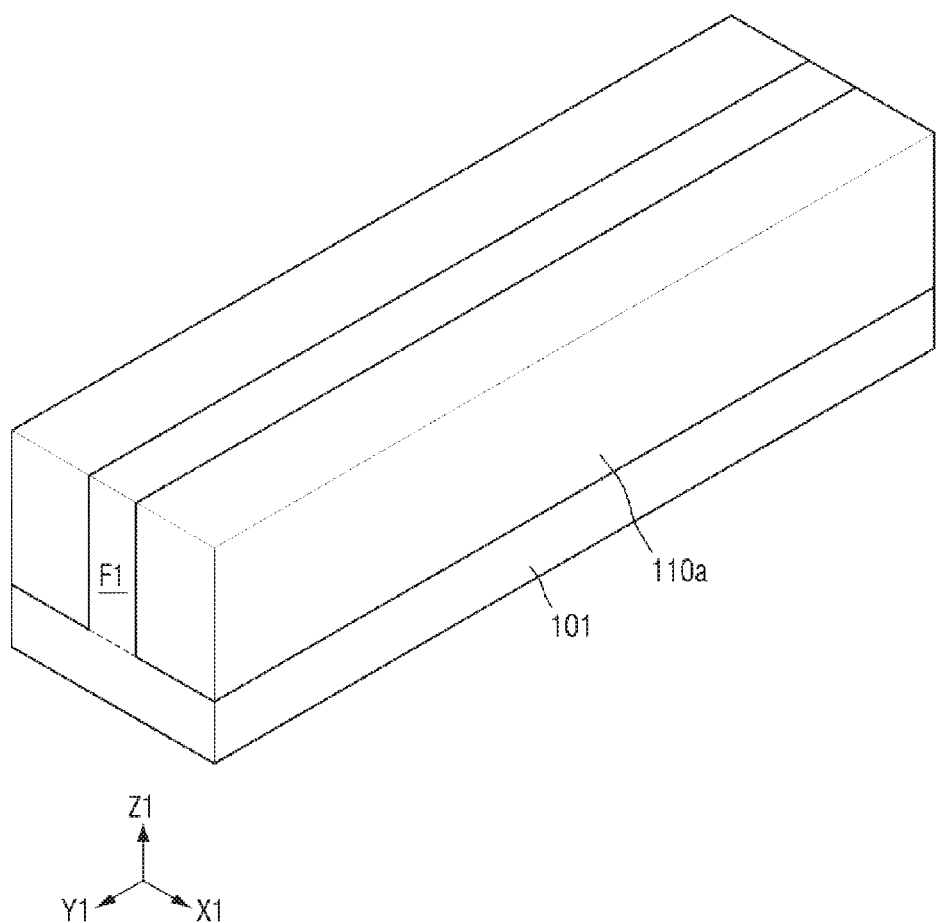

Next, referring to FIG. 15, the insulating film 110*a* may be formed so as to overlay a sidewall of the first fin F1.

The insulating film 110a may be formed of or include a material including at least one of a silicon oxide film, a silicon nitride film, or a silicon oxynitride film.

Next, referring to FIGS. 16 to 18, an upper portion of the insulating film 110a may be recessed, forming the field insulating film 110 and exposing an upper portion of the first fin F1.

The recess process may include a selective etch process.

Meanwhile, a part of the first fin F1 protruding upward from the field insulating film 110 may be formed with the epitaxial process. For example, after formation of the insulating film 110a, instead of proceeding a recess process, a part of the first fin F1 may be formed with the epitaxial process that uses an upper portion of the first fin F1 exposed by the insulating film 110a as a seed.

Further, a threshold voltage adjusting doping may be performed on the exposed first fin F1. For example, when the NMOS transistor is formed, the impurity may be boron (B). When the PMOS transistor is formed, the impurity may be phosphorous (P) and arsenic (As).

Next, first to third sacrificial gate structures 111a, 111b, 111c intersecting the first fin F1 may be formed on the first fin F1. The first to third sacrificial gate structures 111a, 111b, 111c may be spaced apart from each other. Although FIG. 16 illustrates that the first to third sacrificial gate structures 111a, 111b, 111c intersect the first fin F1 in a vertical direction, i.e., in the first direction X1, the example embodiments may not be limited hereto. The first to third sacrificial gate structures 111a, 111b, 111c may intersect the first fin F1 by forming an acute and/or obtuse angle with the first direction X1.

The first to third sacrificial gate structures 111a, 111b, 111c may be formed on an upper surface of the first fin F1 and an upper portion of the sidewall. Further, the first to third sacrificial gate structures 111a, 111b, 111c may be disposed on the field insulating film 110. The first to third sacrificial gate structures 111a, 111b, 111c may be a silicon oxide film, for example.

First to third hard mask films 113a, 113b, 113c may be respectively formed on the first to third sacrificial gate structures 111a, 111b, 111c. The first to third hard mask films 113a, 113b, 113c may be formed of or include a material including at least one of a silicon oxide film, a silicon nitride film, and a silicon oxynitride film.

Next, the first gate spacer 115, the second spacer 116, and the first and second spacers 117 may be formed on both sidewalls of the first to third sacrificial gate structures 111a, 111b, 111c.

Specifically, the first gate spacer 115 may be formed on a side surface of the first sacrificial gate structure 111a, the first and second spacers 117 may be formed on a side surface of the second sacrificial gate structure 111b, and the second gate spacer 116 may be formed on the side surface of the third sacrificial gate structure 111c.

The first gate spacer 115, the second gate spacer 116, and the first and second spacers 117 may expose upper surfaces of the first to third hard mask films 113a, 113b, 113c. The first gate spacer 115, the second gate spacer 116, and the first and second spacers 117 may include a silicon nitride film or a silicon oxynitride film.

Figure 19:
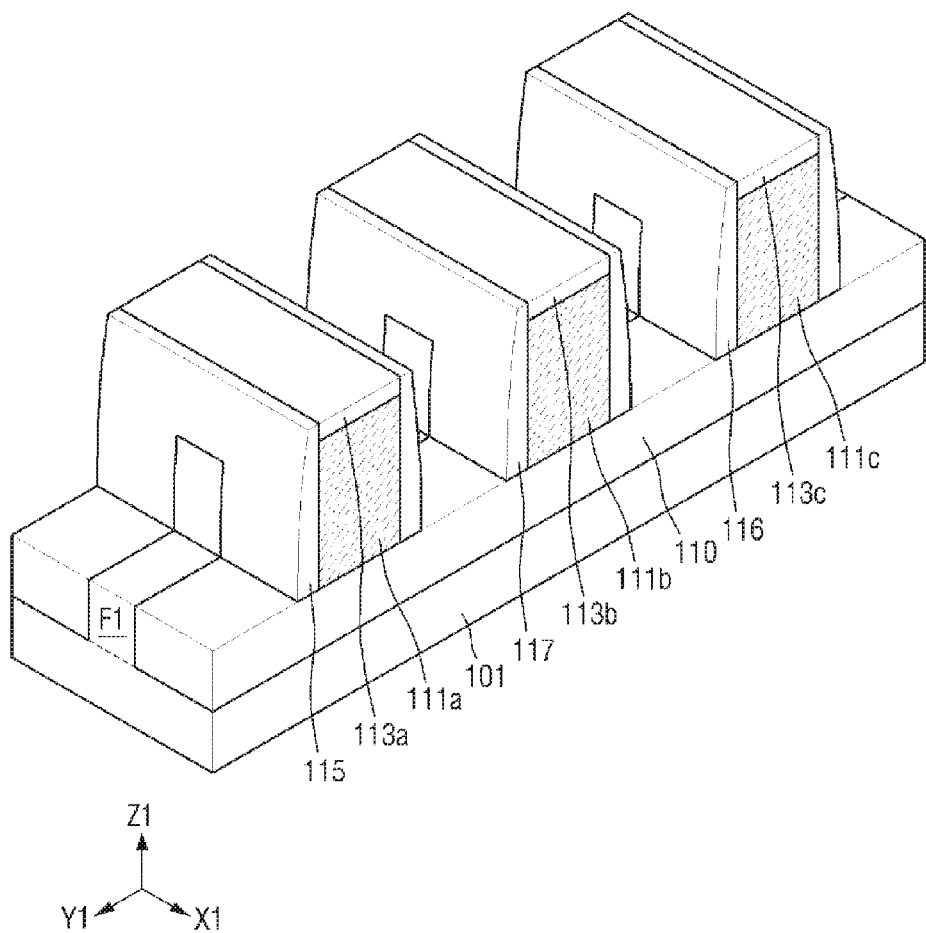

Next, referring to FIG. 19, the first fin F1 may be etched.

A remaining portion of the first fin F1 other than a portion overlain by the first to third sacrificial gate structures 11a, 111b, 111c may be etched. Accordingly, the first fin F1 exposed between the first to third sacrificial gate structures 111a, 111b, 111c may be etched. The first fin F1-F3 may be etched by using the first gate spacer 115, the second gate spacer 116, the first and second spacers 117, and the first to third hard mask films 113a, 113b, 113c as an etch mask.

Next, referring to FIGS. 20 and 21, the first to fourth source/drains 125a, 125b, 123, 124 may be formed on the etched portion of the first fin F1.

In the first fin F1, the first source/drain 125a and the third source/drain 123 may be respectively formed on both sides of the first sacrificial gate structure 111a, the first source/drain 125a and the second source/drain 125b may be respectively formed on both sides of the second sacrificial gate structure 111b, and the second source/drain 125b and the fourth source/drain 124 may be respectively formed on both sides of the third sacrificial gate structure 111c. That is, the first source/drain 125a may be formed between the first sacrificial gate structure 111a and the second sacrificial gate structure 111b, and the second source/drain 125b may be formed between the second sacrificial gate structure 111b and the third sacrificial gate structure 111c.

The first to fourth source/drains 125a, 125b, 123, 124 may be elevated source/drains. Accordingly, the upper surfaces of the first to fourth source/drains 125a, 125b, 123, 124 may be higher than the upper surface of the first fin F1.

When the semiconductor device according to some example embodiments is a PMOS transistor, the first to fourth source/drains 125a, 125b, 123, 124 may include a compressive stress material. For example, the compressive stress material may be a material such as SiGe, which has a greater lattice constant than Si. The compressive stress material may later exert a compressive stress on the first fin F1 (i.e., channel region) under the first and second gate structures 151a, 152b, thereby enhancing mobility of carriers in the channel region.

When the semiconductor device according to an example embodiment is the NMOS transistor, the first to fourth source/drains 125a, 125b, 123, 124 may include a tensile stress material. The first to fourth source/drains 125a, 125b, 123, 124 may be the same material as the substrate 101, or a tensile stress material. For example, when the substrate 101 is Si, the first to fourth source/drains 125a, 125b, 123, 124 may be Si, or a material (e.g., SiC, SiP) that has a lower lattice constant than Si.

The first to fourth source/drains 125a, 125b, 123, 124 may be formed via, for example, epitaxial growth.

Figure 22:
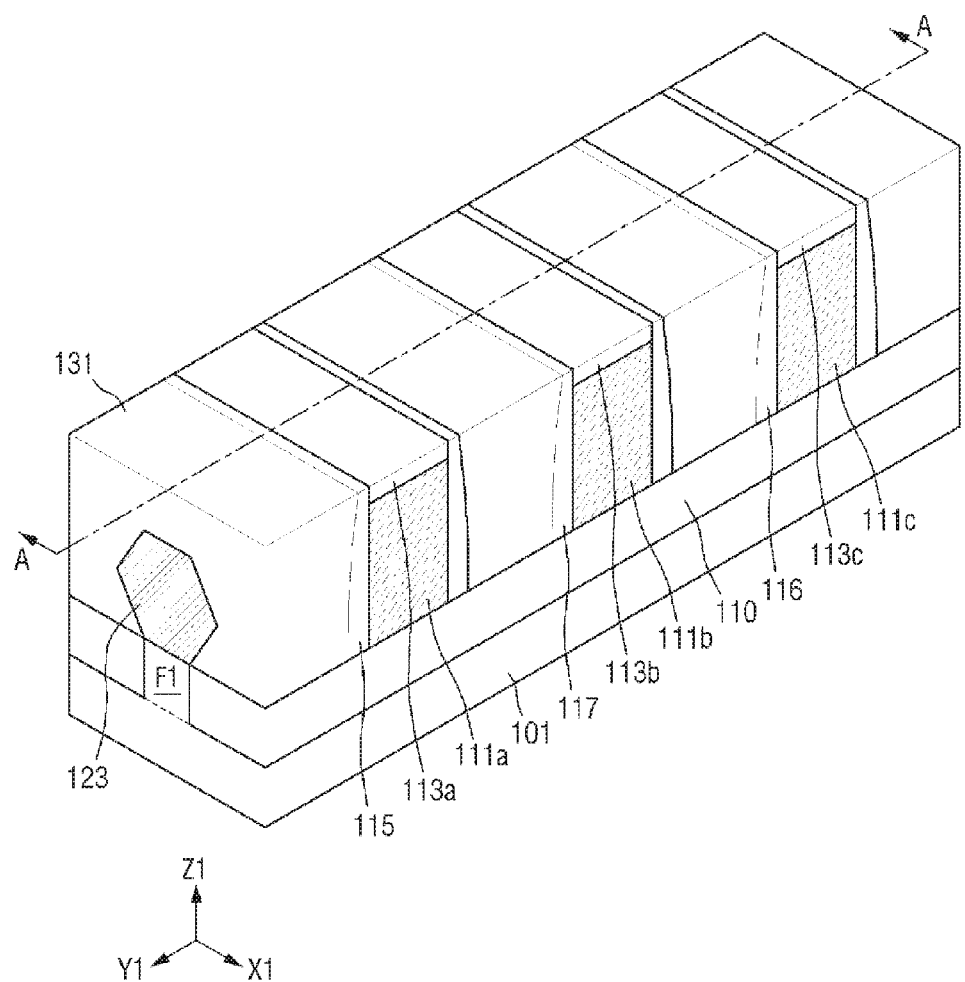
Figure 23:
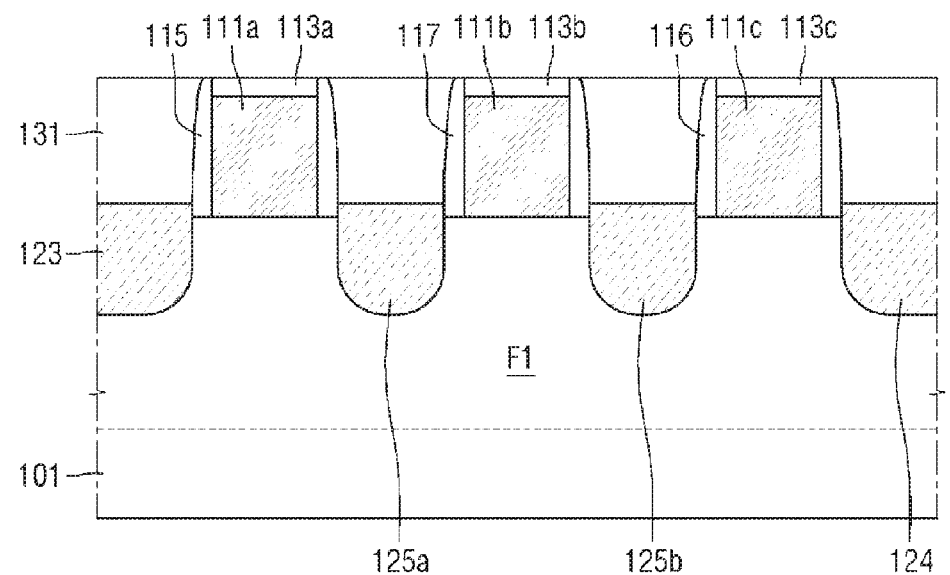

Next, referring to FIGS. 22 and 23, the first interlayer insulating film 131 overlying the first to fourth source/drains 125a, 125b, 123, 124 may be formed.

The first interlayer insulating film 131 may overlay sidewalls of the first gate spacer 115, the second gate spacer 116, and the first and second spacers 117, and expose upper surfaces of the first to third hard mask films 113a, 113b, 113c. For example, the first interlayer insulating film 131 may include an oxide film.

Figure 24:
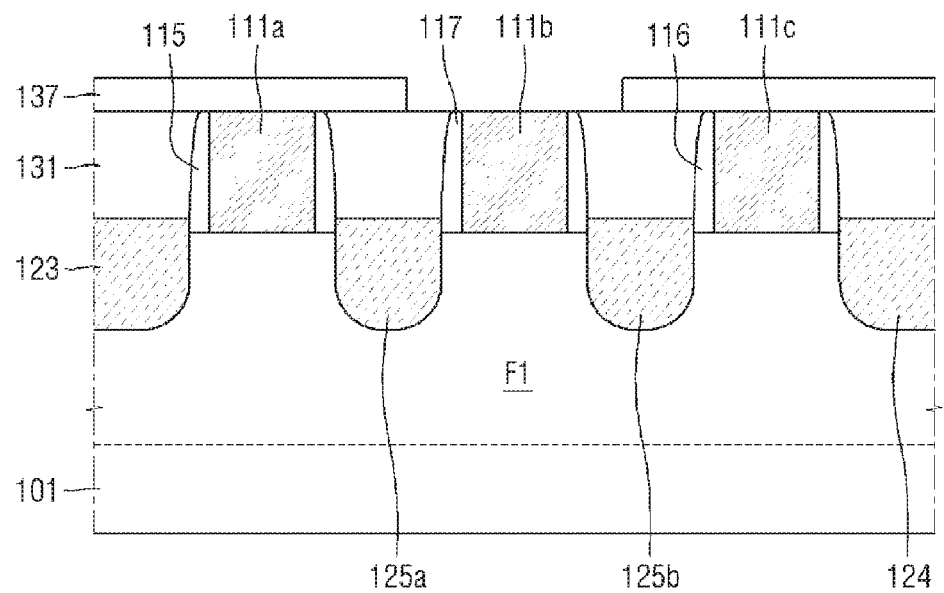

Next, referring to FIG. 24, a first etch mask film 137 exposing the second sacrificial gate structure 111b may be formed on the first to third sacrificial gate structures 111a, 111b, 111c.

A plurality of etch mask films may be formed for more precise and correct performance of the etch process.

In order to form the first etch mask film 137, the process may include forming the first etch mask film 137, forming a photo resist pattern on the first etch mask film 137, and patterning the first etch mask film 137 by using the photo resist pattern.

The first etch mask film 137 may expose the second sacrificial gate structure 111b.

Figure 25:
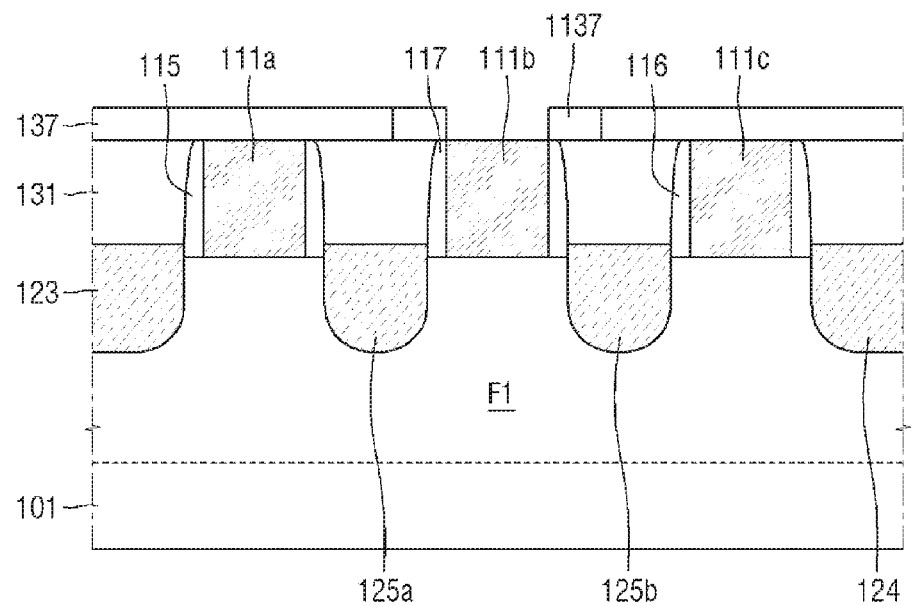

Next, referring to FIG. 25, after the first etch mask film 137 is formed, a first mask spacer 1137 may be formed on a sidewall of the first etch mask film 137.

When the first mask spacer 1137 is formed, the exposed portion of the first interlayer insulating film 131 may be hindered or prevented from being etched. FIGS. 24 and 25 illustrate that the adjacent first interlayer insulating film 131 is exposed as well as the second sacrificial gate structure 111b, although example embodiments are not limited hereto. In the semiconductor device according to some example embodiments, the first etch mask film 137 may expose only the second sacrificial gate structure 111b. In the above case, the first mask spacer 1137 may not be necessarily formed.

Figure 26:
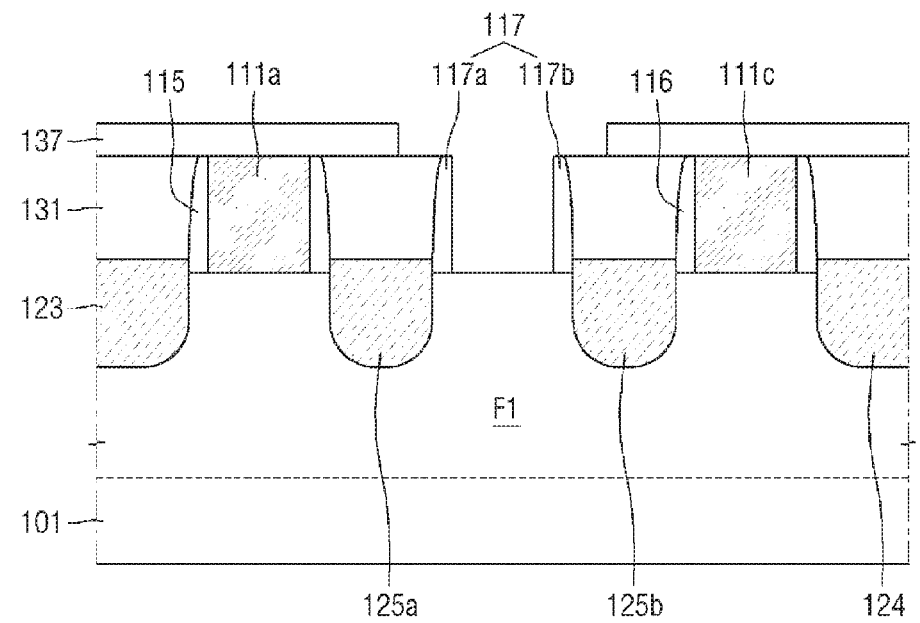

Next, referring to FIG. 26, the second sacrificial gate structure 111b may be removed by using the first etch mask film 137.

Simultaneously or contemporaneously with, or sequentially to, the removal of the second sacrificial gate structure 111b, the first mask spacer 1137 may be removed. The upper surface of the first fin F1 may be exposed by removing the second sacrificial gate structure 111b.

Figure 27:
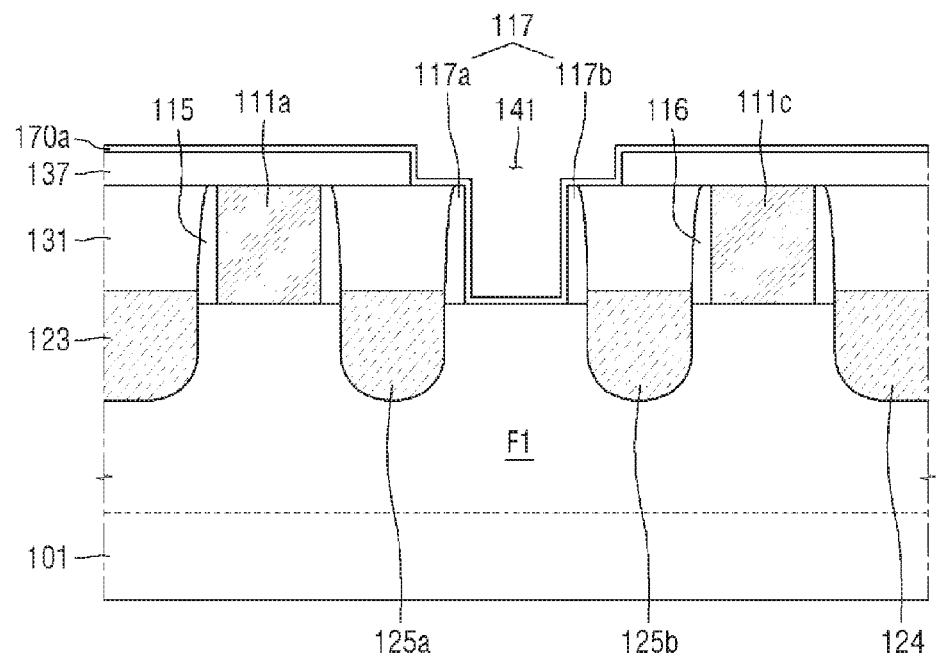

Next, referring to FIG. 27, the inner spacer 170a may be formed within the first recess 141.

As illustrated in FIG. 27, the inner spacer 170a may be formed along an upper surface and a sidewall of the first etch mask film 137, an upper surface and a sidewall of the first and second spacers 117, and the upper surface of the first fin F1.

Figure 28:
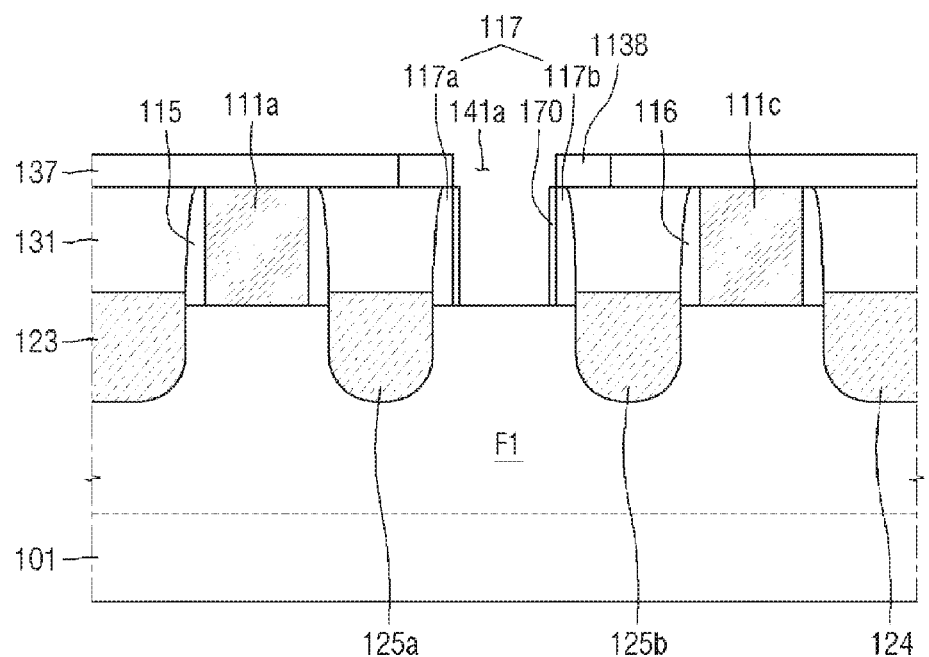

Next, referring to FIG. 28, the spacer 170 may be left only on the sidewall of the first etch mask film 137 and the sidewall of the first and second spacers 117, while the other portions may be removed by using an etch-back process, and so on. Accordingly, the upper surface of the first fin F1 may also be exposed.

Next, a second mask spacer 1138 may be formed.

The second mask spacer 1138 may play a role in blocking the exposed portion of the first interlayer insulating film 131 from etching, for example subsequent etching. According to some example embodiments, the first etch mask film 137 may be formed to overlie the entire first interlayer insulating film 131.

Figure 29:
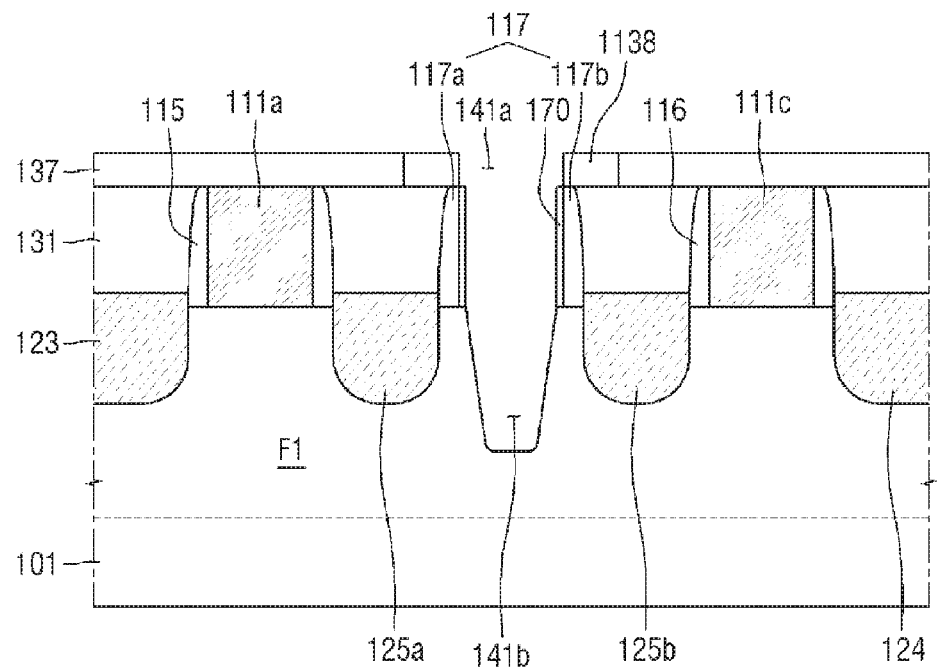

Next, referring to FIG. 29, the second recess 141b may be formed by etching the exposed upper surface of the first fin F1.

The second recess 141b may be formed by using the first etch mask film 137 and the inner spacer 170 as the etch mask. A width of the second recess 141b may be adjusted by adjusting a width of the inner spacer 170. A lower surface of the second recess 141b may be lower than a lower surface of the first to fourth source/drains 125a, 125b, 123, 124.

Figure 30:
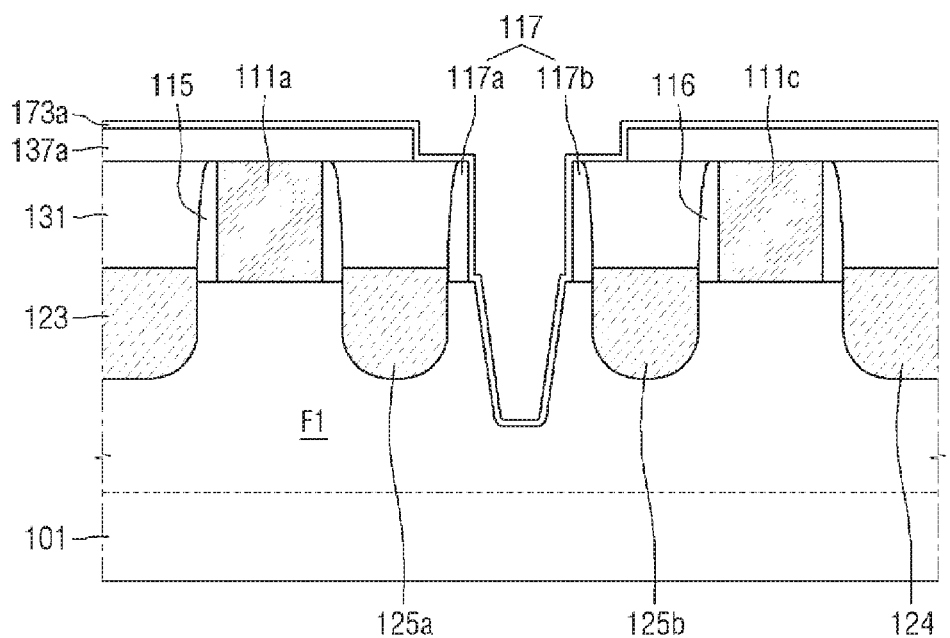

Next, referring to FIG. 30, the second mask spacer 1138 and the inner spacer 170 may be removed.

Next, the liner 173a may be formed. The liner 173a may be formed along the upper surface and the sidewall of the first etch mask film 137, the upper surface and the sidewall of the first and second spacers 117, and an inner surface of the second recess 141b.

For example, the liner 173a may include at least one of an oxide film, a nitride film, and an oxynitride film.

Figure 31:
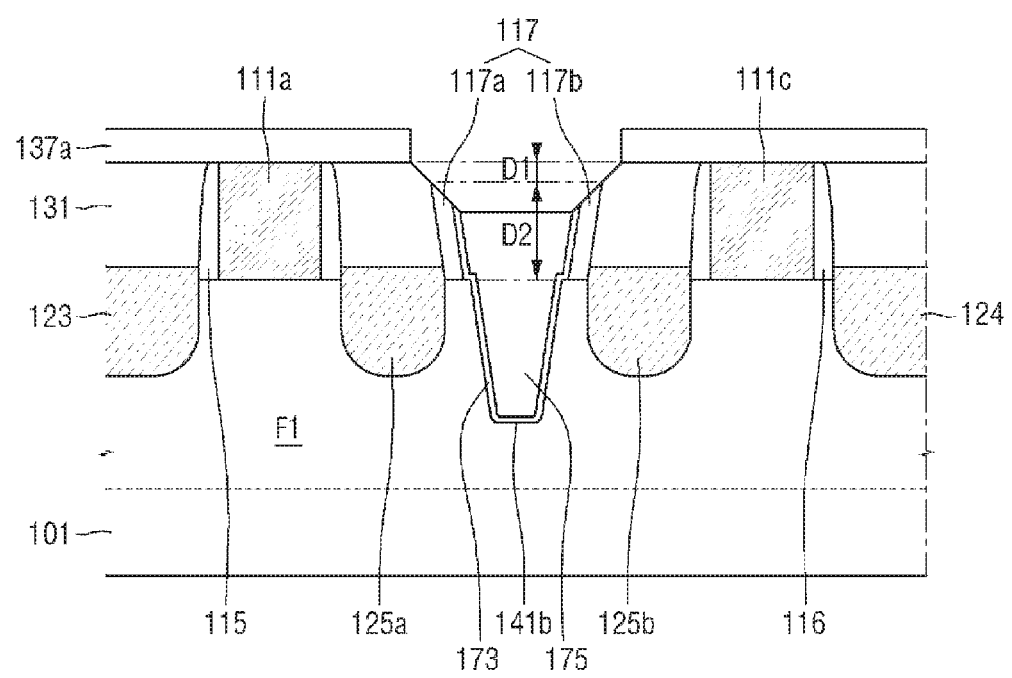

Next, referring to FIG. 31, the device isolating film 175 may be filled in the second recess 141b. The filled device isolating film 175 may have tensile stress characteristic, and accordingly, the first and second spacers 117 may be sloped outwardly.

Next, the first and second spacers 117, the first interlayer insulating film 131, and the device isolating film 175 may be etched by using the first etch mask film 137 as a mask. The above may be referred to as the 'chamfering process'.

Accordingly, a portion of the upper surface of the first interlayer insulating film 131, the upper surface of the first and second spacers 117, and the upper surface of the liner 173 may all be formed at slope. That is, an angle between an outer side surface of the first and second spacers 117 and the upper surface of the first fin F1 may be equal to or greater than about 85 degrees and less than about 90 degrees. However, example embodiments are not limited to the example given above.

Further, a height D2 of the first and second spacers 117 may be less than the height of the first gate structure 151a and the second gate structure 151b. Specifically, a height D2 of the first and second spacers 117 may be less than, by the first distance D1, the height of the first gate structure 1510 and of the second gate structure 151b.

Next, referring to FIGS. 1 to 3, the process of forming the capping film 133 on the device isolating film 175, performing the planarization process, forming the second interlayer insulating film, and forming the silicide film 161 and the first to fourth contacts 165, 163, 164 may be performed.

In an example, as a height of the first and second spacers 117 becomes lower, the first and second contacts 165 can be substantially completely formed. Further, as the first and second spacers 117 may remain rather than being completely removed, the influence of stress on a device of a periphery of the device isolating film 175 can be minimized.

While the example embodiments have been particularly shown and described with reference to example embodiments thereof, it will be understood by those of ordinary skill in the art that various changes in form and details may be made therein without departing from the spirit and scope of the example embodiments as defined by the following claims. It is therefore desired that the example embodiments be considered in all respects as illustrative and not restrictive, reference being made to the appended claims rather than the foregoing description to indicate the scope of the invention.

What is claimed is:

1. A semiconductor device, comprising:
    a substrate including first to third regions, wherein the third region is positioned in a first direction between the first and second regions;
    a fin protruding from the substrate and extending in the first direction;
    first and second gate structures respectively on the fin in the first and second regions;
    first and second spacers spaced apart from each other on the fin in the third region, wherein the first and second spacers are sloped in a direction away from each other, and at least one of a plurality of angles defined by the first and second spacers and an upper surface of the fin is an acute angle;
    a recess between the first and second spacers, wherein sidewalls of the recess comprise the fin and the first and second spacers; and
    a device isolating film filling the recess.

2. The semiconductor device of claim 1, wherein at least one of the angles defined by the first and second spacers and an upper surface of the fin is equal to or greater than about 85 degrees and less than about 90 degrees.

3. The semiconductor device of claim 1, wherein a height of the first and second spacers is less than a height of the first and second gate structures.

4. The semiconductor device of claim 3, wherein the height of the first and second spacers is about 20 nm to about 26 nm.

5. The semiconductor device of claim 1, wherein a width of at least one of the first and second spacers is inversely proportional to a height thereof.

6. The semiconductor device of claim 1, further comprising:
a liner conformal to a sidewall and a bottom surface of the recess under the device isolating film.

7. The semiconductor device of claim 6, wherein an upper surface of the liner is higher than an upper surface of the device isolating film.

8. The semiconductor device of claim 6, wherein an upper surface of the device isolating film decreases as a distance between the device isolation film and the liner increases.

9. The semiconductor device of claim 6, wherein the device isolating film includes $SiO_2$ and the liner includes SiN.

10. The semiconductor device of claim 1, further comprising:
a first source/drain between the first gate structure and the first spacer; and
a second source/drain between the second gate structure and the second spacer.

11. The semiconductor device of claim 10, wherein the first and second source/drains are respectively in contact with the first and second spacers.

12. A semiconductor device, comprising:
a fin protruding from a substrate and extending in a first direction;
first and second gate structures on the fin and spaced apart from each other;
first and second spacers on the fin and between the first and second gate structures, the first and second spacers being spaced apart from each other;
a recess between the first and second spacers, wherein sidewalls of the recess comprise the fin and the first and second spacers; and
a device isolating film filling the recess;
an interlayer insulating film overlying the device isolating film, and the first and second gate structures; and
a contact penetrating the interlayer insulating film respectively on side surfaces of the first and second spacers, the first and second spacers being sloped in a direction of the contact and not being in contact with the contact.

13. The semiconductor device of claim 12, further comprising:
a liner between the device isolating film and the recess.

14. The semiconductor device of claim 12, further comprising:
a first source/drain between the first gate structure and the first spacer; and
a second source/drain between the second gate structure and the second spacer.

15. The semiconductor device of claim 14, wherein the contact is respectively on the first and second source/drains and is electrically connected with the first and second source/drains.

16. A semiconductor device, comprising:
a substrate including first to third regions, wherein the third region is positioned in a first direction between the first and second regions;
a fin protruding from the substrate and extending in the first direction;
first and second gate structures respectively on the fin in the first and second regions;
first and second spacers spaced apart from each other on the fin in the third region, wherein the first and second spacers are sloped in a direction away from each other, and at least one of a plurality of angles defined by the first and second spacers and an upper surface of the fin is an acute angle and;
a recess between the first and second spacers, wherein sidewalls of the recess comprise the fin and the first and second spacers; and
a device isolating film filling the recess,
wherein the first and second spacers have first and second upper surfaces, respectively, and the first and second upper surfaces are sloped so as to be raised in directions away from each other.

17. The semiconductor device of claim 16, wherein a slope of the first and second upper surfaces is smaller than a slope of the side surfaces of the first and second spacers.

18. The semiconductor device of claim 16, further comprising:
a liner along a sidewall and a bottom surface of the recess, the liner separating the device isolation film from the sidewall and bottom surface of the recess.

19. The semiconductor device of claim 16, wherein a height of the first and second spacers is less than a height of the first and second gate structures.

20. The semiconductor device of claim 16, further comprising:
a first source/drain between the first gate structure and the first spacer; and
a second source/drain between the second gate structure and the second spacer.

* * * * *